(12) United States Patent
Mitsuyoshi

(10) Patent No.: US 7,878,213 B2
(45) Date of Patent: Feb. 1, 2011

(54) SUBSTRATE PROCESSING APPARATUS

(75) Inventor: Ichiro Mitsuyoshi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 367 days.

(21) Appl. No.: 11/958,996

(22) Filed: Dec. 18, 2007

(65) Prior Publication Data

US 2008/0156357 A1    Jul. 3, 2008

(30) Foreign Application Priority Data

Dec. 27, 2006    (JP) ............................. 2006-351998

(51) Int. Cl.
B08B 3/00    (2006.01)
(52) U.S. Cl. ...................................... 134/133
(58) Field of Classification Search .................. 134/133
See application file for complete search history.

(56) References Cited

U.S. PATENT DOCUMENTS

| 5,498,294 | A |   | 3/1996  | Matsushita et al. |
|-----------|---|---|---------|-------------------|
| 5,518,542 | A |   | 5/1996  | Matsukawa et al.  |
| 5,989,346 | A | * | 11/1999 | Hiroki ........................ 118/719 |
| 6,874,515 | B2 |  | 4/2005  | Ishihara et al.   |
| 6,893,171 | B2 |  | 5/2005  | Fukutomi et al.   |
| 7,108,752 | B2 | * | 9/2006  | Kuroda ........................ 118/712 |
| 2006/0008342 | A1 |  | 1/2006 | Putzi            |
| 2006/0045722 | A1 |  | 3/2006 | Hashimoto        |

FOREIGN PATENT DOCUMENTS

| CN | 1712333       | 12/2005 |
| JP | 10-275766     | 10/1998 |
| JP | 2002-324828   | 11/2002 |
| JP | 2004-327674   | 11/2004 |
| JP | 2006-012880   | 1/2006  |
| JP | 2006-12880    | 1/2006  |
| KR | 10-2005-0052539 | 6/2005 |

OTHER PUBLICATIONS

Office Action issued Jul. 17, 2009 in corresponding Chinese Application No. 2007-10308112.3.
Decision to Grant a Patent issued Nov. 17, 2009 in connection with corresponding Korean Application No. 10-2007-0132047.
Notice of Reasons for Refusal issued Sept. 14, 2010 in connection with corresponding Japanese Patent Application No. 2006-351998.

* cited by examiner

Primary Examiner—Michael Cleveland
Assistant Examiner—Samuel A Waldbaum
(74) Attorney, Agent, or Firm—Ostrolenk Faber LLP

(57) ABSTRACT

A reversing unit includes a fixed plate, a first movable plate provided so as to face one surface of the fixed plate, a second movable plate provided so as to face the other surface of the fixed plate and a rotary actuator. The rotary actuator rotates the first movable plate, the second movable plate and the fixed plate around a horizontal axis. A distance between the first movable plate and the fixed plate and a distance between the second movable plate and the fixed plate are set to be substantially equal to a difference in height between two hands of a main robot that carry a substrate in and out.

12 Claims, 14 Drawing Sheets

F I G. 1
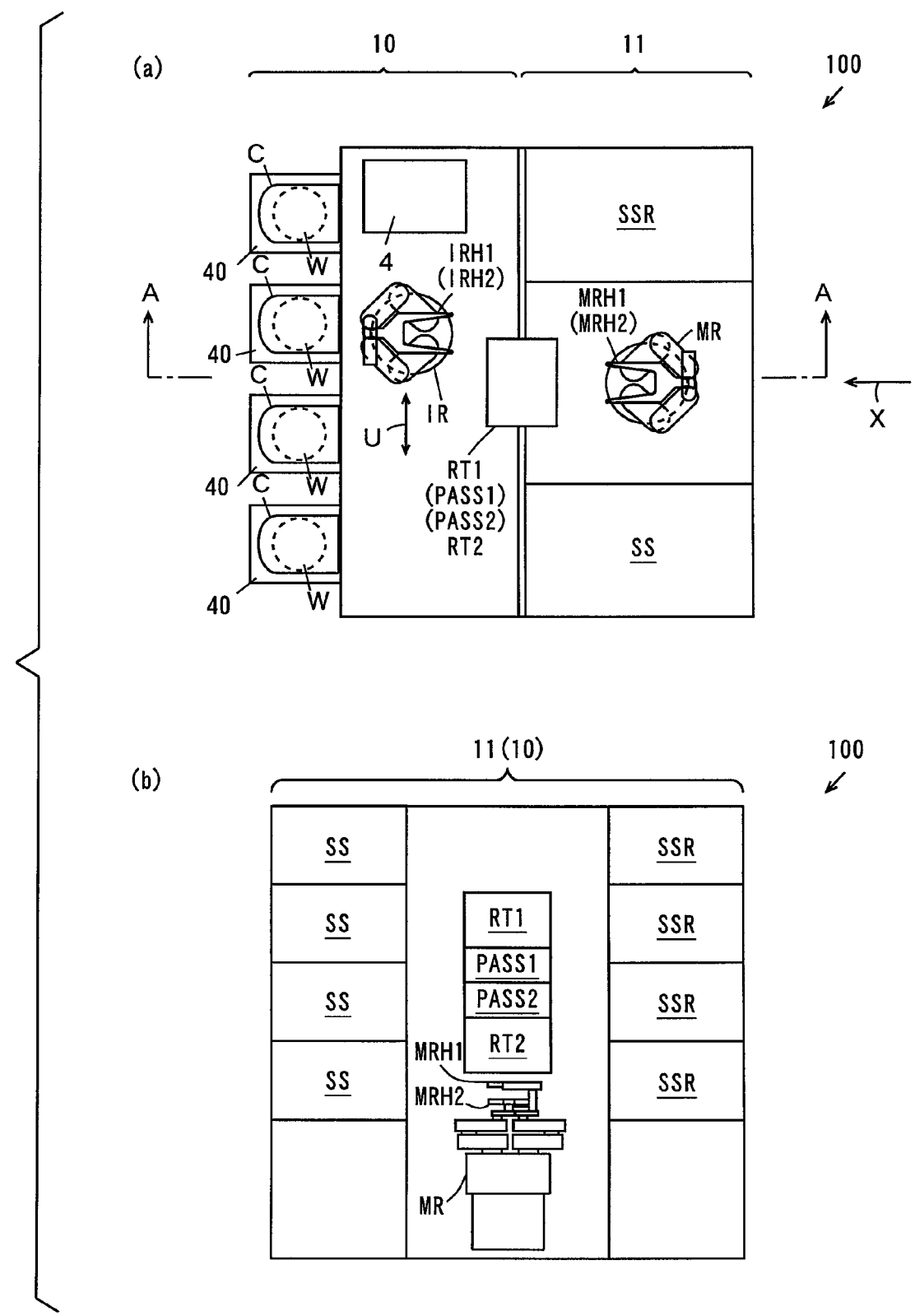

SUBSTRATE PROCESSING APPARATUS

CROSS-REFERENCE TO RELATED APPLICATIONS

The present application is related to the following three applications filed Dec. 18, 2007, and commonly owned:
1) SUBSTRATE TRANSPORTING APPARATUS, SUBSTRATE PLATFORM SHELF AND SUBSTRATE PROCESSING APPARATUS, U.S. Ser. No. 11/958,816,
2) SUBSTRATE PROCESSING APPARATUS AND SUBSTRATE PROCESSING METHOD, U.S. Ser. No. 11/958,891,
3) SUBSTRATE PROCESSING APPARATUS, U.S. Ser. No. 11/959,085,

BACKGROUND OF THE INVENTION

1. Field of the Invention

The present invention relates to a substrate processing apparatus that subjects a substrate to processing.

2. Description of the Background Art

Substrate processing apparatuses have been conventionally used to perform various types of processings on substrates such as semiconductor wafers, glass substrates for photomasks, glass substrates for liquid crystal displays, glass substrates for optical disks or the like.

For example, a substrate processing apparatus that performs a cleaning processing on a back surface of a substrate is provided with a substrate reversing device for reversing the top surface and the back surface of the substrate. For example, the substrate processing apparatus including the substrate reversing device is described in JP 2006-12880 A.

Such a substrate processing apparatus reverses the substrate by the substrate reversing device before performing the cleaning processing on the back surface of the substrate so that the back surface thereof is directed upward. After the cleaning processing is performed on the back surface of the substrate, the substrate is reversed again by the substrate reversing device so that the top surface thereof is directed upward.

Normally, a transport robot carries the substrate into and out of the substrate reversing device. Two hands for holding the substrate are provided so as to vertically overlap with each other in the transport robot. For example, in a case where the transport robot carries the substrate after reversing out of the substrate reversing device by an upper hand with a lower hand holding the substrate before the reversing, and subsequently carries the substrate before the reversing into the substrate reversing device by the lower hand, the following operation is performed. First, the upper hand advances into the substrate reversing device while being positioned at the level of the substrate reversing device, holds the substrate after the reversing and withdraws. Then, after the upper and lower hands are lifted so that the lower hand is positioned at the level of the substrate reversing device, the lower hand advances into the substrate reversing device and places the substrate before the reversing in the substrate reversing device.

As described above, the upper and lower hands are required to be vertically moved in order that the substrate after the reversing is carried out of the substrate reversing device by the one hand and the substrate before the reversing is subsequently carried into the substrate reversing device. Thus, it takes a fixed amount of time to carry the substrate into and out of the substrate reversing device. This prevents the throughput in the substrate processing apparatus from being improved.

SUMMARY OF THE INVENTION

It is an object of the present invention to provide a reversing device that can quickly carry a substrate in and out and a substrate processing apparatus including the same.

(1) According to an aspect of the present invention, a reversing device includes a first holding mechanism that holds a substrate in a state vertical to a first axis, a second holding mechanism that holds the substrate in the state vertical to the first axis, a supporting member that supports the first and second holding mechanisms so that the first and second holding mechanisms overlap with each other in a direction of the first axis, and a rotating device that integrally rotates the supporting member together with the first and second holding mechanisms around a second axis substantially vertical to the first axis.

In the reversing device, the substrate is held by at least one of the first and second holding mechanisms in the state vertical to the first axis. In the state, the first and second holding mechanisms are integrally rotated around the second axis substantially vertical to the first axis by the rotating device. Thus, the substrate held by the first holding mechanism or the second holding mechanism is reversed.

When the substrate is carried into and out of this reversing device by use of two transport holders, the substrate after reversing can be carried out of one of the first and second holding mechanisms by one of the two transport holders, and the substrate before the reversing can be carried into the other one of the first and second holding mechanisms by the other one of the two transport holders. In this case, the first and second holding mechanisms are held so as to overlap with each other in the direction of the first axis. Therefore, the two transport holders are arranged so as to overlap with each other in the direction parallel to the first axis, so that the substrate can be carried into and out of the first and second holding mechanisms without hardly moving the two transport holders in the direction parallel to the first axis. This allows the substrate to be carried into and out of the reversing device quickly.

Moreover, the two transport holders are arranged so as to overlap with each other in the direction parallel to the first axis, so that the two substrates can be simultaneously carried into the first and second holding mechanisms by the two transport holders while the two substrates can be simultaneously carried out of the first and second holding mechanisms by the two transport holders. Accordingly, the substrate can be carried into and out of the reversing device quickly while the plurality of substrates can be reversed efficiently.

(2) The first and second holding mechanisms may include a common reverse holding member having one surface and the other surface that are vertical to the first axis, the first holding mechanism may include a plurality of first supporters that are provided on the one surface of the common reverse holding member and support a periphery of the substrate, a first reverse holding member provided so as to face the one surface of the common reverse holding member, a plurality of second supporters that are provided on a surface of the first reverse holding member facing the common reverse holding member and support the periphery of the substrate, and a first driving mechanism that moves at least one of the first reverse holding member and the common reverse holding member so that the first reverse holding member and the common reverse holding member are selectively shifted between a state where the first reverse holding member and the common reverse holding member are spaced apart from each other in the direction of the first axis and a state where the first reverse holding member and the common reverse holding member are close to each other, and the second holding mechanism may include a plurality of third supporters that are provided on the other surface of the common reverse holding member and support the periphery of the substrate, a second reverse holding member provided so as to face the other surface of the common reverse holding member, a plurality of fourth supporters that are provided on a surface of the second reverse holding member facing the common reverse holding member and support the periphery of the substrate, and a second driving mechanism that moves at least one of the second reverse holding member and the common reverse holding member so that the second reverse holding member and the common reverse holding member are selectively shifted between a state where the second reverse holding member and the common reverse holding member are spaced apart from each other in the direction of the first axis and a state where the second reverse holding member and the common reverse holding member are close to each other.

In this case, the substrate is carried in between the plurality of first supporters provided on the one surface of the common reverse holding member and the plurality of second supporters provided on the surface of the first reverse holding member facing the common reverse holding member in the state where the first reverse holding member and the common reverse holding member are spaced apart from each other. In this state, at least one of the first reverse holding member and the common reverse holding member is moved by the first driving mechanism so that the first reverse holding member and the common reverse holding member are close to each other. Accordingly, the periphery of the substrate is held by the plurality of first and second supporters.

In this state, the first reverse holding member, the second reverse holding member and the common reverse holding member are integrally rotated around the second axis by the rotating device. Thus, the substrate held by the first reverse holding member and the common reverse holding member is reversed.

In addition, the substrate is carried in between the plurality of third supporters provided on the other surface of the common reverse holding member and the plurality of fourth supporters provided on the surface of the second reverse holding member facing the common reverse holding member in the state where the second reverse holding member and the common reverse holding member are spaced apart from each other. In this state, at least one of the second reverse holding member and the common reverse holding member is moved by the second driving mechanism so that the second reverse holding member and the common reverse holding member are close to each other. Accordingly, the periphery of the substrate is held by the plurality of third and fourth supporters.

In this state, the first reverse holding member, the second reverse holding member and the common reverse holding member are integrally rotated around the second axis by the rotating device. Accordingly, the substrate held by the second reverse holding member and the common reverse holding member is reversed.

(3) Each of the first and second holding mechanisms may hold the substrate carried therein by each of the first and second transport holders of a transport device, and a distance between a holding position of the substrate by the first holding mechanism and a holding position of the substrate by the second holding mechanism may be substantially equal to a distance between a holding position of the substrate by the first transport holder of the transport device and a holding position of the substrate by the second transport holder.

In this case, the substrate after the reversing can be carried out of one of the first and second holding mechanisms by one of the first and second transport holders and the substrate before the reversing can be carried into the other one of the first and second holding mechanisms by the other one of the first and second transport holders without hardly moving the first and second transport holders of the transport device in the direction parallel to the first axis. This allows the substrate to be carried into and out of the reversing device quickly.

Moreover, the two substrates can be simultaneously carried into the first and second holding mechanisms by the first and second transport holders while the two substrates can be simultaneously carried out of the first and second holding mechanisms by the first and second transport holders. Accordingly, the substrate can be carried into and out of the reversing device quickly while the plurality of substrates can be reversed efficiently.

(4) The common reverse holding member, the first reverse holding member and the second reverse holding member may have notch regions through which the first and second transport holders of the transport device can pass in the direction of the first axis.

In this case, even though the lengths of the plurality of first, second, third and fourth supporters are short in the direction parallel to the first axis, the first and second transport holders of the transport device can move through the notch regions of the common reverse holding member, the first reverse holding member and the second reverse holding member. This allows the first and second transport holders to place the substrate on any of the plurality of first, second, third and fourth supporters without coming into contact with the common reverse holding member, the first reverse holding member and the second reverse holding member.

In addition, the first and second transport holders can receive the substrate from any of the plurality of first, second, third and fourth supporters without coming into contact with the common reverse holding member, the first reverse holding member and the second reverse holding member.

Thus, the lengths of the first, second, third and fourth supporters in the direction parallel to the first axis can be shortened, and the reversing device can be reduced in size.

(5) A substrate processing apparatus according to another aspect of the present invention that performs processing on a substrate having a top surface and a back surface includes a reversing device that reverses the top surface and the back surface of the substrate and a transport device that has first and second transport holders and carries the substrate into and out of the reversing device, and the reversing device includes a first holding mechanism that holds the substrate in a state vertical to a first axis, a second holding mechanism that holds the substrate in the state vertical to the first axis, a supporting member that supports the first and second holding mechanisms so that the first and second holding mechanisms overlap with each other in a direction of the first axis, and a rotating device that integrally rotates the support member together with the first and second holding mechanisms around a second axis that is substantially vertical to the first axis.

In this substrate processing apparatus, the substrate is carried into and out of the reversing device by the first and second transport holders of the transport device. In the reversing device, the substrate carried therein is held by the first or second holding mechanism in the state vertical to the first axis. In the state, the first and second holding mechanisms are integrally rotated around the second axis that is substantially vertical to the first axis by the rotating device. Thus, the substrate held by the first or second holding mechanism is reversed.

In this case, the substrate after the reversing can be carried out of one of the first and second holding mechanisms by one of the first and second transport holders, and the substrate after the reversing can be carried into the other one of the first and second holding mechanisms by the other one of the first and second transport holders. Furthermore, the first and second holding mechanisms are supported so as to overlap with each other in the direction of the first axis. Therefore, the first and second transport holders are arranged so as to overlap with other in the direction parallel to the first axis, so that the substrate can be carried into and out of the first and second holding mechanisms without hardly moving the first and second transport holders in the direction parallel to the first axis. This allows the substrate to be carried into and out of the reversing device quickly. Accordingly, the throughput in the substrate processing apparatus can be improved.

In addition, the first and second transport holders are arranged so as to overlap with each other in the direction parallel to the first axis, so that the two substrates can be simultaneously carried into the first and second holding mechanisms by the first and second transport holders while the two substrates can be simultaneously carried out of the first and second holding mechanisms by the first and second transport holders.

Thus, the substrate can be carried into and out of the reversing device quickly while the plurality of substrates can be reversed efficiently. This allows the throughput in the substrate processing apparatus to be improved.

(6) A distance between a holding position of the substrate by the first holding mechanism and a holding position of the substrate by the second holding mechanism may be substantially equal to a distance between a holding position of the substrate by the first transport holder of the transport device and a holding position of the substrate by the second transport holder.

In this case, the substrate after the reversing can be carried out of one of the first and second holding mechanisms by one of the first and second transport holders and the substrate after the reversing can be carried into the other one of the first and second holding mechanisms by the other one of the first and second transport holders without moving the first and second transport holders of the transport device in the direction parallel to the first axis. This allows the substrate to be carried into and out of the reversing device quickly.

Moreover, the two substrates can be simultaneously carried into the first and second holding mechanisms by the first and second transport holders while the two substrates can be simultaneously carried out of the first and second holding mechanisms by the first and second transport holders. Accordingly, the substrate can be carried into and out of the reversing device quickly while the plurality of substrates can be reversed efficiently.

(7) The first and second holding mechanisms may include a common reverse holding member having one surface and the other surface that are vertical to the first axis, the first holding mechanism may include a plurality of first supporters that are provided on the one surface of the common reverse holding member and support a periphery of the substrate, a first reverse holding member provided so as to face the one surface of the common reverse holding member, a plurality of second supporters provided on a surface of the first reverse holding member facing the common reverse holding member and support the periphery of the substrate, and a first driving mechanism that moves at least one of the first reverse holding member and the common reverse holding member so that the first reverse holding member and the common reverse holding member are selectively shifted between a state where the first reverse holding member and the common reverse holding member are spaced apart from each other in the direction of the first axis and a state where the first reverse holding member and the common reverse holding member are close to each other, and the second holding mechanism may include a plurality of third supporters provided on the other surface of the common reverse holding member and support the periphery of the substrate, a second reverse holding member provided so as to face the other surface of the common reverse holding member, a plurality of fourth supporters provided on a surface of the second reverse holding member facing the common reverse holding member and support the periphery of the substrate, and a second driving mechanism that moves at least one of the second reverse holding member and the common reverse holding member so that the second reverse holding member and the common reverse holding member are selectively shifted between a state where the second reverse holding member and the common reverse holding member are spaced apart from each other in the direction of the first axis and a state where the second reverse holding member and the common reverse holding member are close to each other.

In this case, the substrate is carried in between the plurality of first supporters provided on the one surface of the common reverse holding member and the plurality of second supporters provided on the surface of the first reverse holding member facing the common reverse holding member in the state where the first reverse holding member and the common reverse holding member are spaced apart from each other. In the state, at least one of the first reverse holding member and the common reverse holding member is moved by the first driving mechanism so that the first reverse holding member and the common reverse holding member are close to each other. Accordingly, the periphery of the substrate is held by the plurality of first and second supporters.

In this state, the first reverse holding member, the second reverse holding member and the common reverse holding member are integrally rotated around the second axis by the rotating device. Thus, the substrate held by the first reverse holding member and the common reverse holding member is reversed.

Moreover, the substrate is carried in between the plurality of third supporters provided on the other surface of the common reverse holding member and the plurality of fourth supporters provided on the surface of the second reverse holding member facing the common reverse holding member in the state where the second reverse holding member and the common reverse holding member are spaced apart from each other. In the state, at least one of the second reverse holding member and the common reverse holding member is moved by the second driving mechanism so that the second reverse holding member and the common reverse holding member are close to each other. Thus, the periphery of the substrate is held by the plurality of third and fourth supporters.

In this state, the first reverse holding member, the second reverse holding member and the common reverse holding member are integrally rotated around the second axis by the rotating device. Accordingly, the substrate held by the second reverse holding member and the common reverse holding member is reversed.

(8) The common reverse holding member, the first reverse holding member and the second reverse holding member may have notch regions through which the first and second transport holders of the transport device can pass in the direction of the first axis.

In this case, even though the lengths of the plurality of first, second, third and fourth supporters are short in the direction parallel to the first axis, the first and second transport holders of the transport device can move through the notch regions of the common reverse holding member, the first reverse holding member and the second reverse holding member. Thus, the first and second transport holders can place the substrate on any of the plurality of first, second, third and fourth supporters without coming into contact with the common reverse holding member, the first reverse holding member and the second reverse holding member.

In addition, the first and second transport holders can receive the substrate from any of the plurality of first, second, third and fourth supporters without coming into contact with the common reverse holding member, the first reverse holding member and the second reverse holding member.

Accordingly, the lengths of the first, second, third and fourth supporters in the direction parallel to the first axis can be shortened and the reversing device can be reduced in size.

(9) The transport device may include an advance/withdrawing mechanism that advances and withdraws the first and second transport holders, each of the first and second transport holders may have a plurality of holding portions extending in a direction of forward and backward movements of the first and second transport holders, the notch regions of the common reverse holding member, the first reverse holding member and the second reverse holding member may include a plurality of notch portions through which the plurality of holding portions of the first and second transport holders can pass.

In this case, the first and second transport holders enter the first and second holding mechanisms of the reversing deice or exit from the first and second holding mechanisms by being advanced/withdrawn by the advance/withdrawing mechanism. At this time, the first and second transport holders can advance and withdraw so that the plurality of holding portions extending in the direction of the forward and backward movements of the first and second transport holders can pass through the plurality of notch portions of the notch regions.

(10) A distance between tips of the plurality of first supporters and tips of the plurality of fourth supporters and a distance between tips of the plurality of second supporters and tips of the plurality of third supporters may be set to be substantially equal to the distance between the holding position of the substrate by the first transport holder of the transport device and the holding position of the substrate by the second transport holder.

In this case, the substrate can be received from one of the plurality of first and fourth supporters by one of the first and second transport holders while the substrate before the reversing can be placed on the other one of the plurality of first and fourth supporters by the other one of the first and second transport holders without moving the first and second transport holders of the transport device in the direction parallel to the first axis.

Moreover, the substrate can be received from one of the plurality of second and third supporters by one of the first and second transport holders while the substrate before the reversing can be placed on the other one of the plurality of second and third supporters by the other one of the first and second transport holders without moving the first and second transport holders of the transport device in the direction parallel to the first axis.

Furthermore, the two substrates can be simultaneously placed on the plurality of first and fourth supporters by the first and second transport holders while the two substrates can be simultaneously received from the plurality of first and fourth supporters by the first and second transport holders. In addition, the two substrates can be simultaneously placed on the plurality of second and third supporters by the first and second transport holders while the two substrates can be simultaneously received from the plurality of second and third supporters by the first and second transport holders.

(11) The common reverse holding member may be secured to the support member, the first driving mechanism may move the first reverse holding member relative to the common reverse holding member so that the first reverse holding is selectively shifted between the state where the first reverse holding member and the common reverse holding member are spaced apart from each other and the state where the first reverse holding member and the common reverse holding member are close to each other, and the second driving mechanism may move the second reverse holding member relative to the common reverse holding member so that the second reverse holding member is selectively shifted between the state where the second reverse holding member and the common reverse holding member are spaced apart from each other and the state where the second reverse holding member and the common reverse holding member are close to each other.

In this case, the first reverse holding member is moved by the first driving mechanism so as to be close to the common reverse holding member, so that the substrate is held by the plurality of first and second supporters. In addition, the second reverse holding member is moved by the second driving mechanism so as to be close to the common reverse holding member, so that the substrate is held by the plurality of third and fourth supporters. This allows the substrate to be reversed in the simple configuration.

(12) The common reverse holding member may include a third reverse holding member provided so as to face the first reverse holding member and a fourth reverse holding member provided so as to face the second reverse holding member, the plurality of first supporters may be provided on a surface of the third reverse holding member facing the first reverse holding member, the plurality of third supporters may be provided on a surface of the fourth reverse holding member facing the second reverse holding member, the first driving mechanism may move at least one of the first reverse holding member and the third reverse holding member so that the first reverse holding member and the third reverse holding member are selectively shifted between a state where the first reverse holding member and the third reverse holding member are spaced apart from each other and a state where the first reverse holding member and the third reverse holding member are close to each other, the second driving mechanism may move at least one of the second reverse holding member and the fourth reverse holding member so that the second reverse holding member and the fourth reverse holding member are selectively shifted between a state where the second reverse holding member and the fourth reverse holding member are spaced apart from each other and a state where the second reverse holding member and the fourth reverse holding member are close to each other.

In this case, the first and third reverse holding members are moved by the first driving mechanism so as to be close to each other, and consequently, the substrate is held by the plurality of first and second supporters. Moreover, the second and fourth reverse holding members are moved by the second driving mechanism so as to be close to each other, and consequently, the substrate is held by the plurality of third and forth supporters.

Accordingly, a space between the holding position of the substrate by the first holding mechanism and the holding position of the substrate by the second holding mechanism can be adjusted arbitrarily.

(13) The substrate processing apparatus may further include a first cleaning processing unit that cleans the back surface of the substrate and the transport device may transport the substrate between the reversing device and the first cleaning processing unit.

In this case, the substrate reversed by the reversing device so that the back surface thereof is directed upward is transported to the first cleaning processing unit by the transport device. In the first cleaning processing unit, the back surface of the substrate directed upward is cleaned. The substrate after the cleaning by the first cleaning processing unit is transported to the reversing device by the transport device, and reversed again by the reversing device so that the top surface thereof is directed upward.

(14) The substrate processing apparatus may further include a second cleaning processing unit that cleans the top surface of the substrate and the transport device may transport the substrate among the reversing device, the first cleaning processing unit and the second cleaning processing unit.

In this case, the substrate with the top surface thereof directed upward is transported to the second cleaning processing unit by the transport device. In the second cleaning processing unit, the top surface of the substrate directed upward is cleaned.

According to the present invention, the substrate can be carried into and out of the reversing device quickly. Thus, the throughput in the substrate processing apparatus can be improved.

Other features, elements, characteristics, and advantages of the present invention will become more apparent from the following description of preferred embodiments of the present invention with reference to the attached drawings.

BRIEF DESCRIPTION OF THE DRAWINGS

FIG. 1 is a diagram showing a configuration of a substrate processing apparatus according to a first embodiment;

DESCRIPTION OF THE PREFERRED EMBODIMENTS

A reversing device and a substrate processing apparatus including the same according to one embodiment of the present invention will now be described with reference to drawings.

In the following description, a substrate refers to a semiconductor wafer, a glass substrate for a liquid crystal display, a glass substrate for a PDP (plasma display panel), a glass substrate for a photomask, and a substrate for an optical disk or the like.

In the following description, a surface of the substrate on which a variety of patterns such as a circuit pattern or the like are to be formed is referred to as a top surface, while the opposite surface thereof is referred to as a back surface. In addition, a surface of the substrate directed downward is referred to as a lower surface, while a surface of the substrate directed upward is referred to as an upper surface.

(1) First Embodiment

A substrate processing apparatus according to a first embodiment will now be described with reference to drawings.

(1-1) Configuration of the Substrate Processing Apparatus

Figure 2:
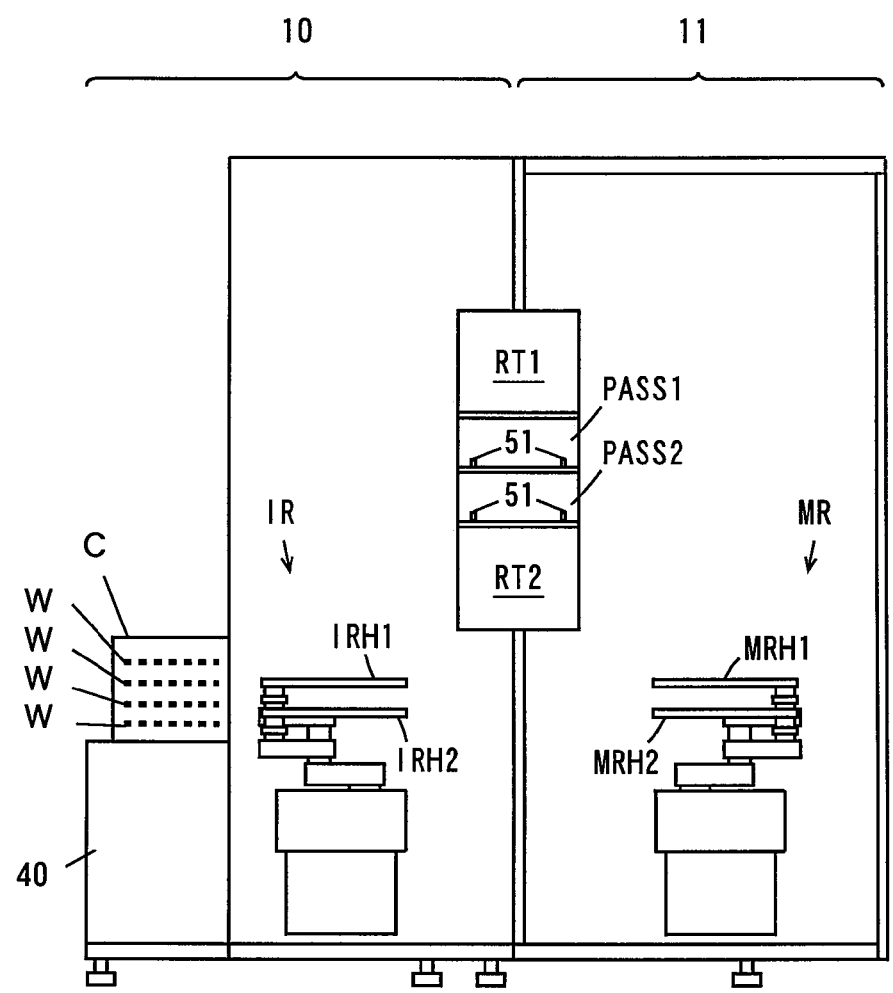
FIG. 2 is a diagram showing the configuration of the substrate processing apparatus according to the first embodiment.

FIG. 1(a) is a plan view of the substrate processing apparatus according to a first embodiment of the present invention, and FIG. 1(b) is a schematic side view in which the substrate processing apparatus of FIG. 1(a) is seen from a direction of the arrow X. FIG. 2 is a diagram schematically showing a cross section of FIG. 1(a) taken along the line A-A.

As shown in FIG. 1(a), the substrate processing apparatus 100 includes an indexer block 10 and a processing block 11. The indexer block 10 and the processing block 11 are provided in parallel to each other.

The indexer block 10 is provided with a plurality of carrier platforms 40, an indexer robot IR and a controller 4. Carriers C that store a plurality of substrates W in multiple stages are placed on the carrier platforms 40, respectively. The indexer robot IR is constructed so that it can move in the direction of the arrow U (FIG. 1(a)), rotate around a vertical axis and move up and down. The indexer robot IR has hands IRH1, IRH2 provided one above the other for receiving and transferring the substrate W. The hands IRH1, IRH2 hold a peripheral portion of the lower surface of the substrate W and an outer circumference of the substrate W. The controller 4 is composed of a computer or the like including a CPU (central processing unit) and controls each unit in the substrate processing apparatus 100.

As shown in FIG. 1(b), a plurality of top surface cleaning units SS (four units in this example), a plurality of back surface cleaning units SSR (four units in this example) and a main robot MR are provided in the processing block 11. One side of the processing block 11 has a vertical stack of the plurality of top surface cleaning units SS, and the other side of the processing block 11 has a vertical stack of the plurality of back surface cleaning units SSR. The main robot MR is provided between the plurality of top surface cleaning units SS and the plurality of back surface cleaning units SSR. The main robot MR is constructed so that it can rotate around a vertical axis and move up and down. Moreover, the main robot MR has hands MRH1, MRH2 provided one above the other for receiving and transferring the substrate W. The hands MRH1, MRH2 hold the peripheral portion of the lower surface of the substrate W and the outer circumference of the substrate W. Details of the main robot MR will be described later.

As shown in FIG. 2, reversing units RT1, RT2 for reversing the substrate W and substrate platforms PASS1, PASS2 for receiving and transferring the substrate between the indexer robot IR and the main robot MR are provided one above another between the indexer block 10 and the processing block 11. The reversing unit RT1 is provided above the substrate platforms PASS1, PASS2, and the reversing unit RT2 is provided below the substrate platforms PASS1, PASS2. Details of the reversing units RT1, RT2 will be described later.

The upper substrate platform PASS1 is used for transporting the substrate W from the processing block 11 to the indexer block 10, and the lower substrate platform PASS 2 is used for transporting the substrate W from the indexer block 10 to the processing block 11.

Optical sensors (not shown) that detect the presence or absence of the substrate W are provided in the substrate platforms PASS1, PASS2. This enables determination to be made whether or not the substrate W is placed on the substrate platform PASS1, PASS2. In addition, a plurality of support pins 51 that support the lower surface of the substrate W are attached to each of the substrate platforms PASS1, PASS2. The substrate W is temporarily placed on the support pins 51 of the substrate platforms PASS1, PASS2, when the substrate W is received and transferred between the indexer robot IR and the main robot MR.

(1-2) Summary of Operations of the Substrate Processing Apparatus

Next, a summary of operations of the substrate processing apparatus 100 will be described with reference to FIG. 1 and FIG. 2. Note that an operation of each component of the substrate processing apparatus 100, described below, is controlled by the controller 4 of FIG. 1.

First, the indexer robot IR takes out the unprocessed substrate W from one of the carriers C placed on the carrier platform 40 by use of the lower hand IRH2. At this point, the top surface of the substrate W is directed upward. The hand IRH2 of the indexer robot IR holds the peripheral portion of the back surface of the substrate W and the outer circumference of the substrate W. The indexer robot IR turns around the vertical axis while moving in the direction of the arrow U and places the unprocessed substrate W on the substrate platform PASS2.

The substrate W placed on the substrate platform PASS2 is received by the main robot MR, and subsequently carried into the top surface cleaning unit SS. In the top surface cleaning unit SS, the cleaning processing is performed on the top surface of the substrate W. Hereinafter, the cleaning processing of the top surface of the substrate W is referred to as the top surface cleaning processing. Note that details of the top surface cleaning processing by the top surface cleaning unit SS will be described later.

The substrate W after the top surface cleaning processing is carried out of the top surface cleaning unit SS by the main robot MR, and subsequently carried into the reversing unit RT1. In the reversing unit RT1, the substrate W with the top surface thereof directed upward is reversed so that the back surface thereof is directed upward. Details of the operations of the reversing unit RT1, RT2 will be described later. The substrate W after the reversing is carried out of the reversing unit RT1 by the main robot MR, and subsequently carried into the back surface cleaning unit SSR. In the back surface cleaning unit SSR, the cleaning processing is preformed on the back surface of the substrate W. Hereinafter, the cleaning processing of the back surface of the substrate W is referred to as the back surface cleaning processing. Note that details of the back surface cleaning processing by the back surface cleaning unit SSR will be described later.

The substrate W after the back surface cleaning processing is carried out of the back surface cleaning unit SSR by the main robot MR, and subsequently carried into the reversing unit RT2. In the reversing unit RT2, the substrate W with the back surface thereof directed upward is reversed so that the top surface thereof is directed upward. The substrate W after the reversing is carried out of the reversing unit RT2 by the main robot MR, and placed on the substrate platform PASS1. The substrate W placed on the substrate platform PASS1 is received by the indexer robot IR, and stored in the carrier C.

(1-3) Details of the Main Robot

Details of the configuration of the main robot MR will now be described. FIG. 3(a) is a side view of the main robot MR, and FIG. 3(b) is a plan view of the main robot MR.

As shown in FIG. 3(a) and FIG. 3(b), the main robot MR includes a base 21, to which a moving portion 22 is attached so as to be able to vertically move and turn with respect to the base 21. The hands MRH1 and MRH2 are connected to the moving portion 22 by multi-joint type arms AM1 and AM2, respectively.

The moving portion 22 is moved up and down by a lifting mechanism 25 provided in the base 21 while being turned around a vertical axis by a turning driving mechanism 26 provided in the base 21. The multi-joint type arms AM1, AM2 are independently driven by driving mechanisms that are not shown, respectively, and move the respective hands MRH1, MRH2 forward and backward in the horizontal direction while keeping them in fixed postures. Each of the hands MRH1, MRH2 is arranged to have a certain height with respective to the moving portion 22, and the hand MRH1 is positioned above the hand MRH2. A difference M1 (FIG. 3(a)) in height between the hand MRH1 and the hand MRH2 is maintained to be constant.

The hands MRH1, MRH2 have the same shape and are formed to be approximately U-shaped, respectively. The hand MRH1 has two claw portions H11 extending substantially in parallel to each other and the hand MRH2 has two claw portions H12 extending substantially in parallel to each other. Furthermore, a plurality of support pins 23 are attached on the hands MRH1, MRH2, respectively. In the present embodiment, the four support pins 23 are attached on the upper surface of the hands MRH1, MRH2, respectively, at substantially equal distances from each other along the outer circumference of the substrate W placed thereon. The peripheral portion of the lower surface of the substrate W and the outer circumference of the substrate W are held by the four support pins 23.

Here, an order of the operations of the main robot MR in the present embodiment will be described with reference to FIG. 1 and FIG. 2.

First, the main robot MR receives the unprocessed substrate W from the substrate platform PASS2 by the hand MRH2. Next, the main robot MR carries the substrate W after the top surface cleaning processing out of any of the top surface cleaning units SS by the hand MRH1, and carries the substrate W held by the hand MRH2 into the same top surface cleaning unit SS. The main robot MR subsequently carries the substrate W with the back surface thereof directed upward out of the reversing unit RT1 by the hand MRH2, and carries the substrate W with the top surface thereof directed upward that is held by the hand MRH1 into the reversing unit RT1.

Then, the main robot MR carries the substrate W after the back surface cleaning processing out of any of the back surface cleaning units SSR by the hand MRH1, and carries the substrate W held by the hand MRH2 into the same back surface cleaning unit SSR. The main robot MR subsequently carries the substrate W with the top surface thereof directed upward out of the reversing unit RT2 by the hand MRH2, and carries the substrate W with the back surface thereof directed upward that is held by the hand MRH1 into the reversing unit RT2. Next, the main robot MR places the substrate W held by the hand MRH2 on the substrate platform PASS1, and receives the unprocessed substrate W from the substrate platform PASS2 by the hand MRH2. The main robot performs a series of such operations successively.

(1-4) Details of the Reversing Unit

Figure 4:
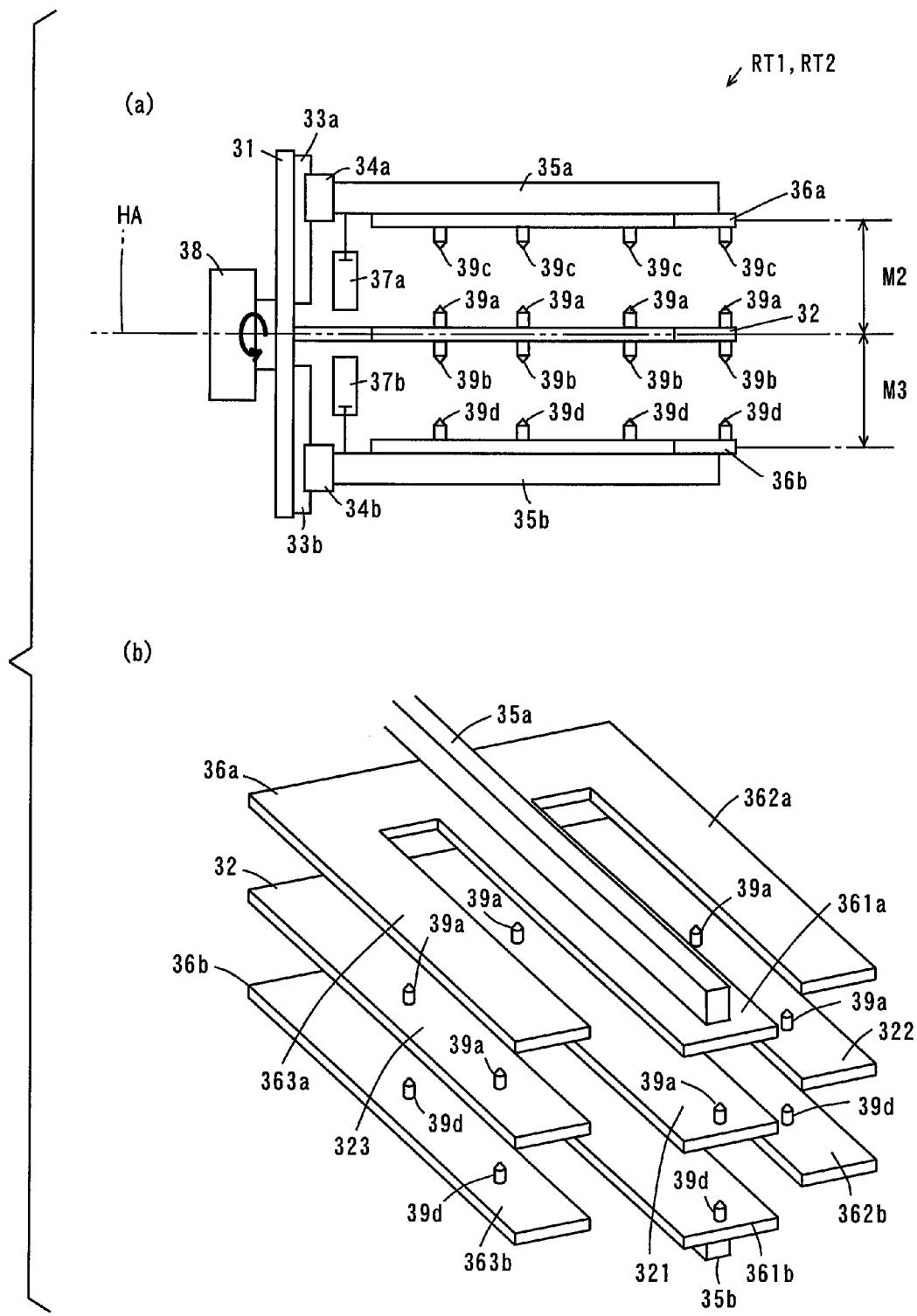
FIG. 4 is a diagram showing details of a reversing unit.

Next, details of the reversing units RT1, RT2 are described. The reversing units RT1, RT2 have the same configuration. FIG. 4(a) is a side view of the reversing unit RT1, RT2, and FIG. 4(b) is a perspective view of the reversing unit RT1, RT2.

As shown in FIG. 4(a), the reversing unit RT1, RT2 includes a support plate 31, a fixed plate 32, a pair of linear guides 33a, 33b, a pair of support members 35a, 35b, a pair of cylinders 37a, 37b, a first movable plate 36a, a second movable plate 36b and a rotary actuator 38.

The support plate 31 is provided so as to extend vertically, to which the fixed plate 32 is attached so that it extends horizontally from the center of one surface of the support plate 31. The linear guide 33a extending in a vertical direction to the fixed plate 32 is provided in a region of the support plate 31 on one surface side of the fixed plate 32. In addition, the linear guide 33b extending in the vertical direction to the fixed plate 32 is provided in the region of the support plate 31 on the other surface side of the fixed plate 32. The linear guides 33a, 33b are provided symmetrically with respect to the fixed plate 32.

The support member 35a is provided so as to extend in a parallel direction to the fixed plate 32 on the one surface side of the fixed plate 32. The support member 35a is slidably attached to the linear guide 33a by a coupling member 34a. The cylinder 37a is connected to the support member 35a and moves the support member 35a up and down along the linear guide 33a. In this case, the support member 35a moves in the vertical direction to the fixed plate 32 while being maintained in a fixed posture. Moreover, the first movable plate 36a is attached to the support member 35a so as to face the one surface of the fixed plate 32.

On the other surface side of the fixed plate 32, the support member 35b is provided so as to extend in the parallel direction to the fixed plate 32. The support member 35b is slidably attached to the linear guide 33b by a coupling member 34b. The support member 35b is connected to the cylinder 37b, which moves the support member 35b up and down along the linear guide 33b. In this case, the support member 35b moves in the vertical direction to the fixed plate 32 while being maintained in a fixed posture. Furthermore, the second movable plate 36b is attached to the support member 35b so as to face the other surface of the fixed plate 32.

Figure 3:
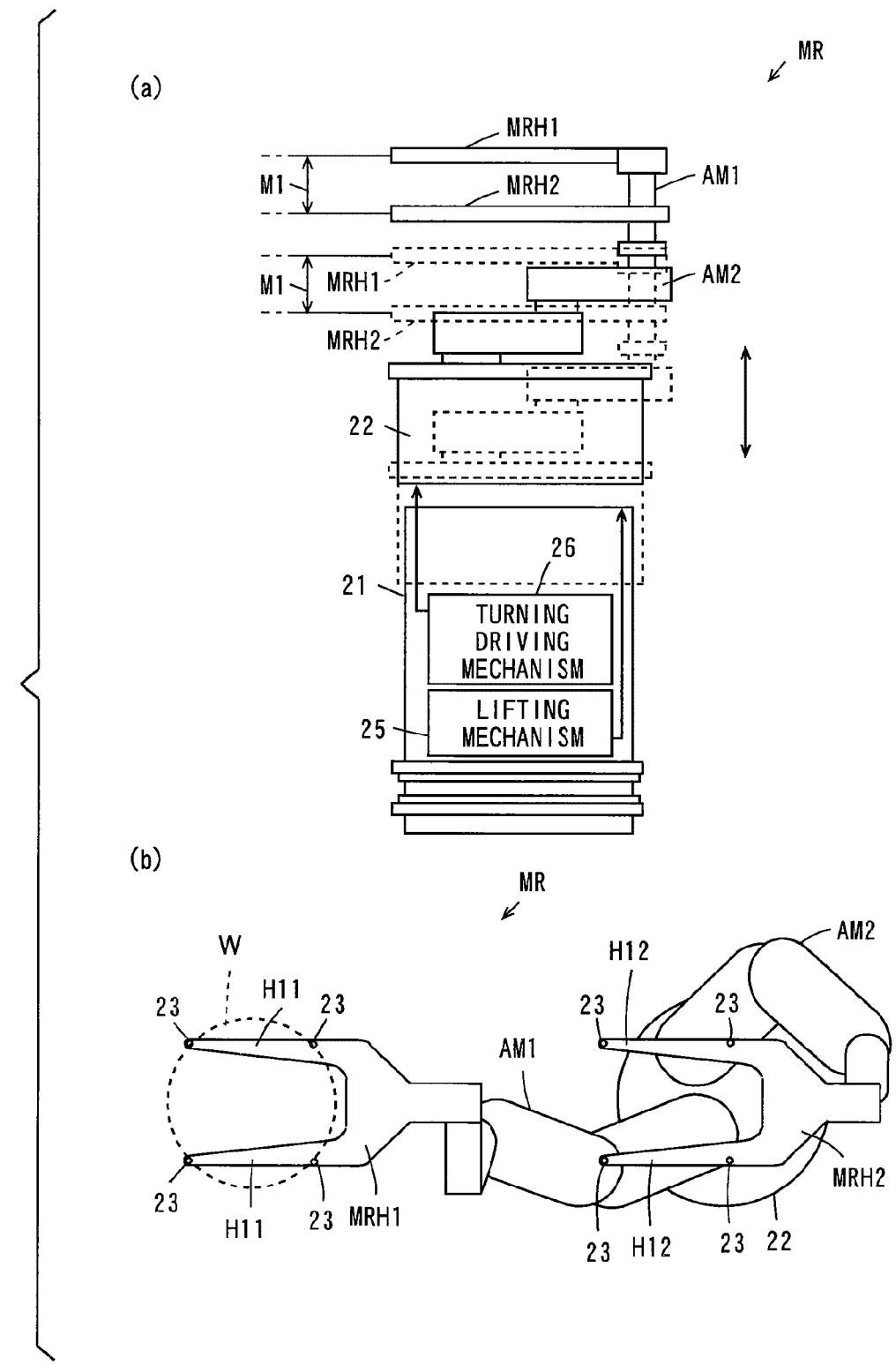
FIG. 3 is a diagram showing details of a main robot.

With the first movable plate 36a and the second movable plate 36b being farthest away from the fixed plate 32, a distance M2 between the first movable plate 36a and the fixed plate 32 and a distance M3 between the second movable plate 36b and the fixed plate 32 are set to be substantially equal to the difference M1 in height between the hand MRH1 and the hand MRH2 of the main robot MR shown in FIG. 3 in the present embodiment.

The rotary actuator 38 rotates the support plate 31 around the horizontal axis HA. Accordingly, the first movable plate 36a, the second movable plate 36b and the fixed plate 32 that are coupled to the support plate 31 rotate around the horizontal axis HA.

As shown in FIG. 4(b), the first movable plate 36a, the fixed plate 32 and the second movable plate 36b have substantially the same shape.

The first movable plate 36a includes a central support portion 361a extending along the support member 35a and side portions 362a, 363a extending in parallel to the central support portion 361a on both sides of the central support portion 361a. The side portions 362a, 363a are provided symmetrically with respect to the central support portion 361a. The respective one tips of the central support portion 361a and the side portions 362a, 363a are coupled to one another on the support plate 31 (FIG. 4(a)) side. In this way, the first movable plate 36a is formed to be substantially E-shaped, and a striped notch region is formed between the central support portion 361a and the side portions 362a, 363a.

The fixed plate 32 includes a central support portion 321 and side portions 322, 323 corresponding to the central support portion 361a and the side portions 362a, 363a of the first movable plate 36a, and the respective one tips of the central support portion 321 and the side portions 322, 323 are coupled with one another on the support plate 31 side. Thus, the fixed plate 32 is formed to be substantially E-shaped, and a striped notch region is formed between the central support portion 321 and the side portions 322, 323.

The second movable plate 36b includes a central support portion 361b and side portions 362b, 363b corresponding to the central support portion 361a and the side portions 362a, 363a of the first movable plate 36a, and the respective one tips of the central support portion 361b and the side portions 362b, 363b are coupled with one another on the support plate 31 side. Accordingly, the second movable plate 36b is formed to be substantially E-shaped, and a striped notch region is formed between the central support portion 361a and the side portions 362b, 363b.

As shown in FIG. 4(a), a plurality of support pins 39a are provided on the one surface of the fixed plate 32 facing the first movable plate 36a, and a plurality of support pins 39b are provided on the other surface of the fixed plant 32. Moreover, a plurality of support pins 39c are provided on one surface of the first movable plate 36a facing the fixed plate 32, and a plurality of support pins 39d are provided on one surface of the second movable plate 36b facing the fixed plate 32.

In the present embodiment, respective six pieces of the support pins 39a, 39b, 39c, 39d are provided. These support pins 39a, 39b, 39c, 39d are arranged along the outer circumference of the substrate W that is carried into the reversing units RT1, RT2. Moreover, the support pins 39a, 39b, 39c, 39d have the same length. Therefore, with the first movable plate 36a and the second movable plate 36b being farthest away from the fixed plate 32, a distance between the tips of the support pins 39a and the tips of the support pins 39d and a distance between the tips of the support pins 39b and the tips of the support pins 39c are substantially equal to the difference M1 in height between the hand MRH1 and the hand MRH2 of the main robot MR shown in FIG. 3.

Note that the distance M2 between the first movable plate 36a and the fixed plate 32 and the distance M3 between the second movable plate 36b and the fixed plate 32 may be suitably changed. With the first movable plate 36a and the second movable plate 36b being farthest away from the fixed plate 32, the distance between the tips of the support pins 39c and the tips of the support pins 39d is set to be larger than the difference M1 in height between the hand MRH1 and the hand MRH2.

(1-5) Operations of the Reversing Units

Figure 5:
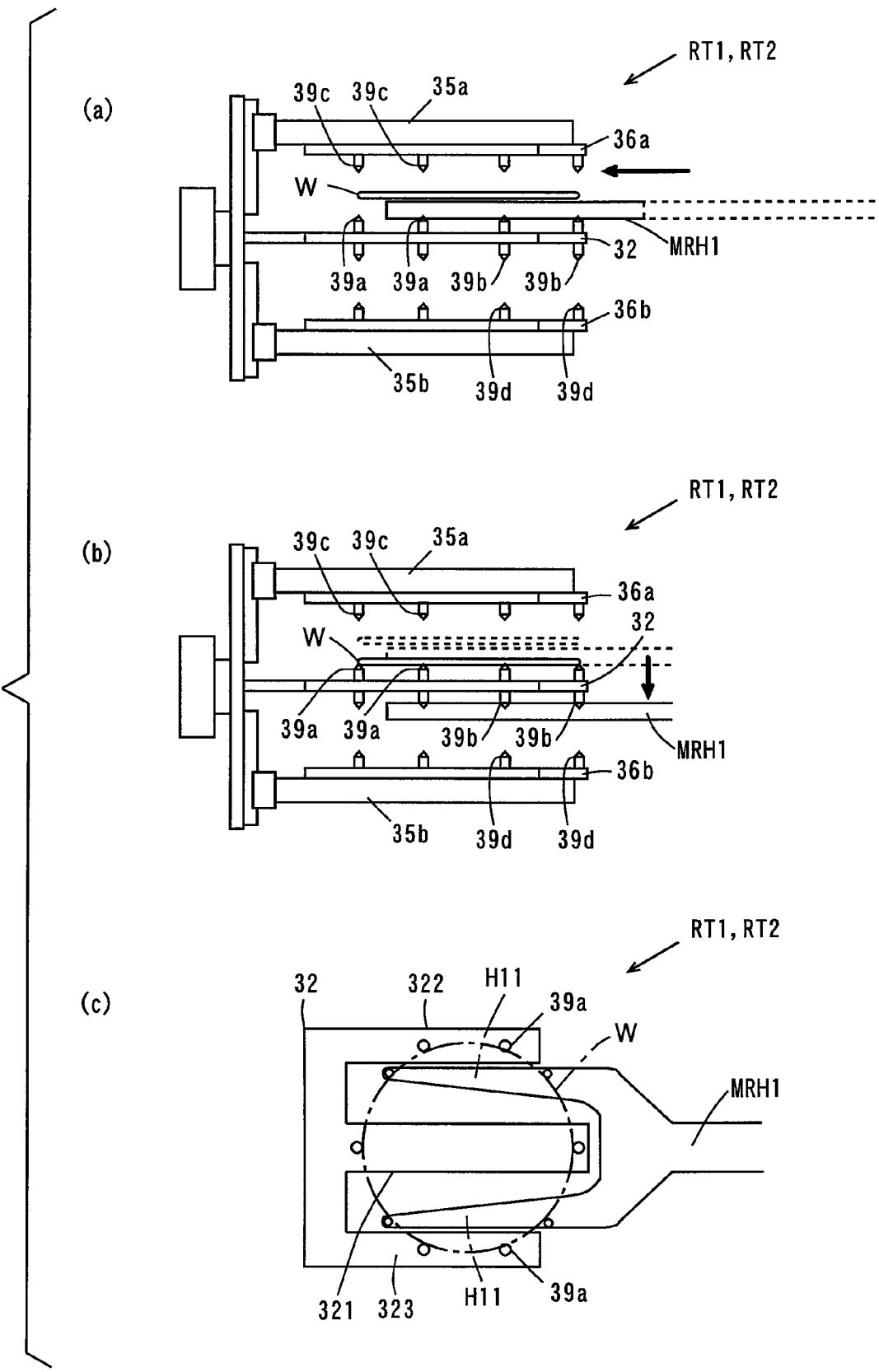
FIG. 5 is a diagram showing operations of the reversing unit.
Figure 6:
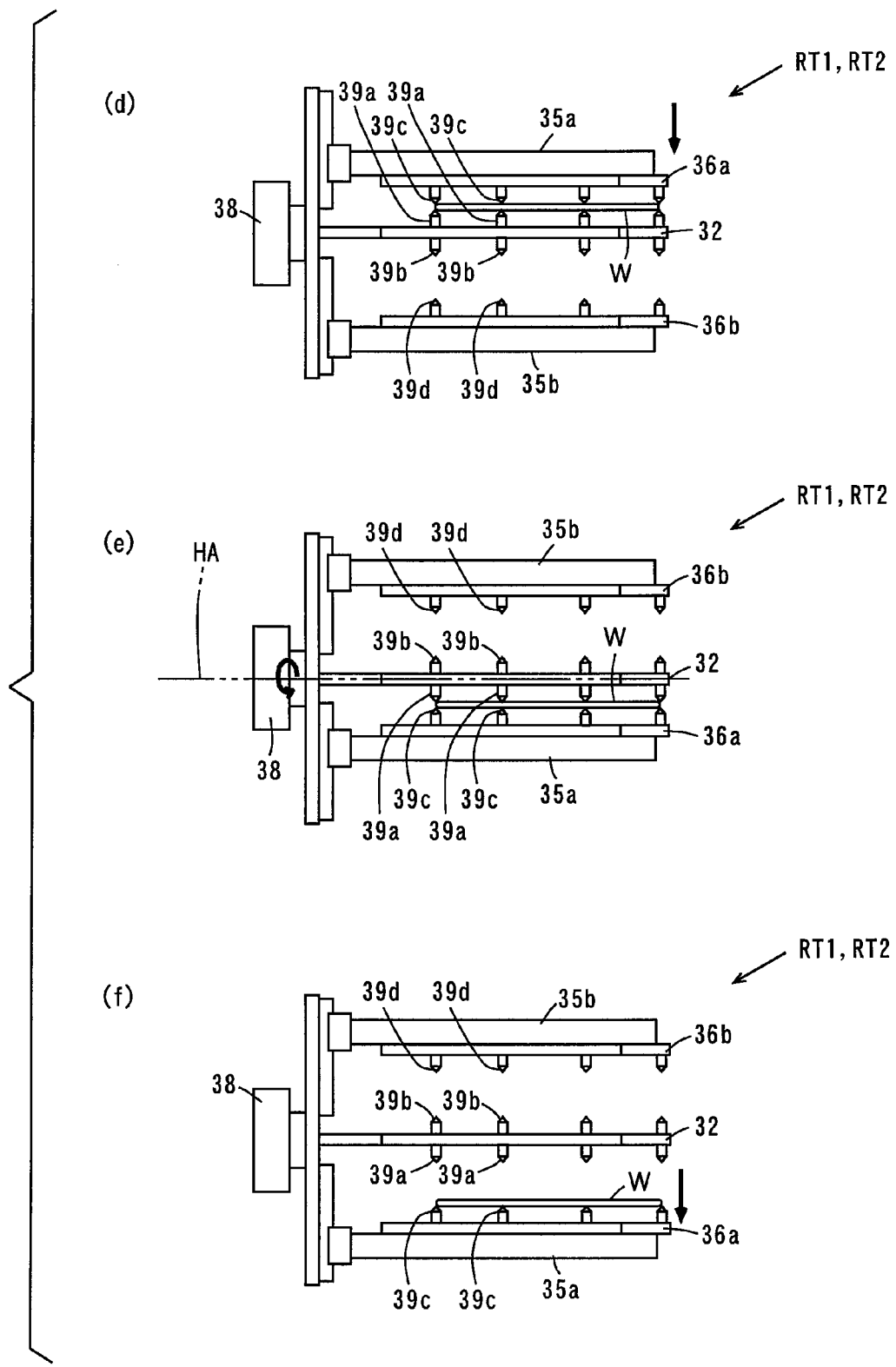
FIG. 6 is a diagram showing the operations of the reversing unit.
Figure 7:
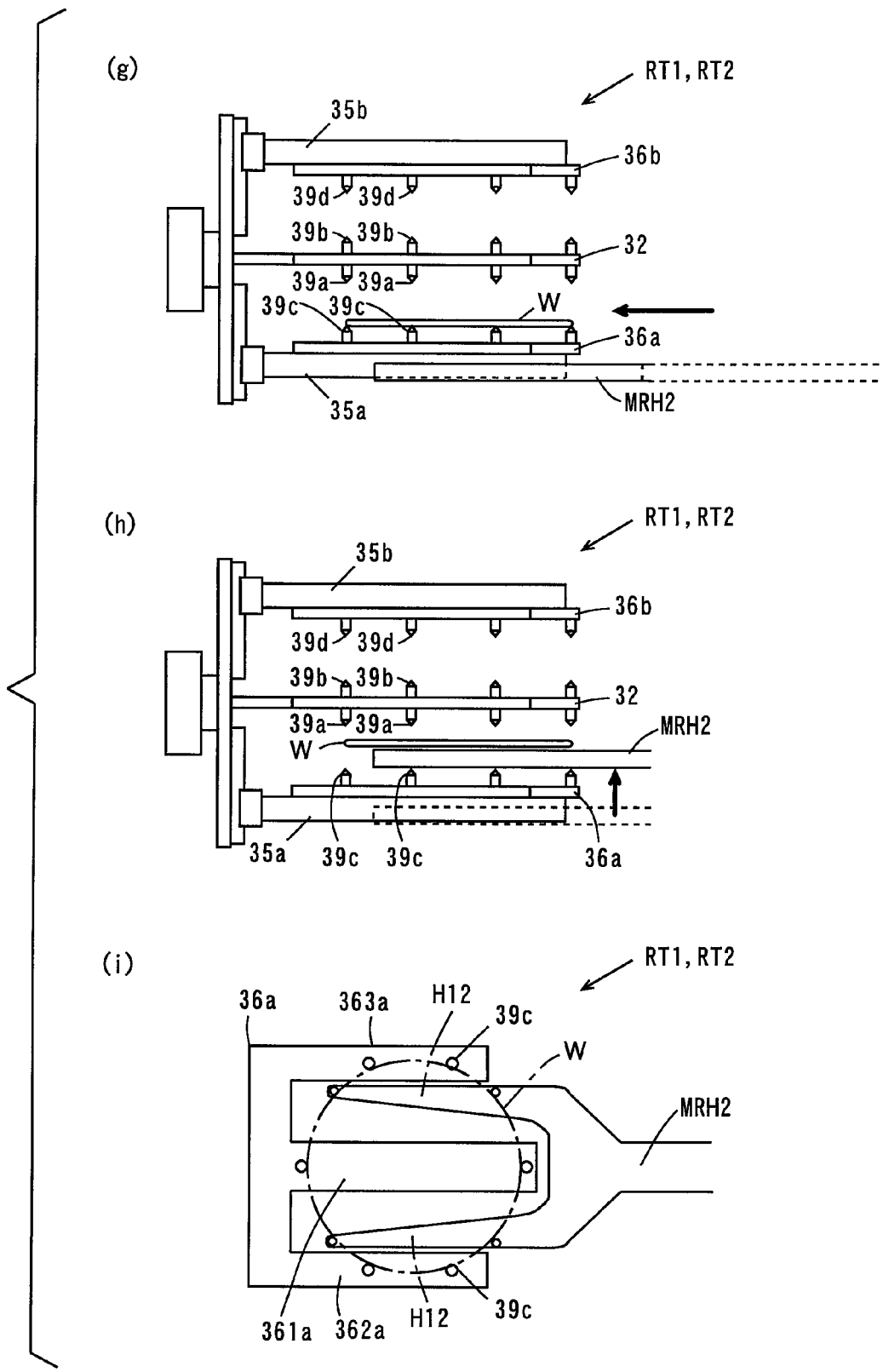
FIG. 7 is a diagram showing the operations of the reversing unit.

Next, operations of the reversing unit RT1, RT2 will be described. FIGS. 5-7 are diagrams for explaining the operations of the reversing unit RT1, RT2. Note that the hand MRH1 of the main robot MR carries the substrate W into the reversing unit RT1, RT2, and the hand MRH2 of the main robot MR carries the substrate W out of the reversing units RT1, RT2 as described above.

As shown in FIG. 5(a), the hand MRH1 of the main robot MR holding the substrate W advances between the first movable plate 36a and the fixed plate 32 with the first movable plate 36a, the fixed plate 32 and the second movable plate 36b maintained in horizontal postures. Then, the hand MRH1 is lowered as shown in FIG. 5(b). In this case, the claw portions H11 of the hand MRH1 are lowered through the notch region between the central support portion 321 and the side portions 322, 323 of the fixed plate 32 as shown in FIG. 5(c). Accordingly, the substrate W held by the hand MRH1 is placed on the support pins 39a on the fixed plate 32.

Note that the substrate W with the top surface thereof directed upward is placed on the support pins 39a in the reversing unit RT1, and the substrate W with the back surface thereof directed upward is placed on the support pins 39a in the reversing unit RT2.

Next, the support member 35a is lowered by the cylinder 37a (FIG. 4(a)) as shown in FIG. 6(d). Thus, the first movable plate 36a is lowered so that the distance between the first movable plate 36a and the fixed plate 32 is shortened. The first movable plate 36a is lowered by a predetermined distance, so that the peripheral portion and the outer circumference of the substrate W are held by the support pins 39a on the fixed plate 32 and the support pins 39c on the first movable plate 36a. In this state, the rotary actuator 38 integrally rotates the first movable plate 36a, the fixed plate 32 and the second movable plate 36b around the horizontal axis HA by 180 degrees as shown in FIG. 6(e). Accordingly, the substrate W held by the support pins 39a and the support pins 39c is reversed. In this case, the back surface of the substrate W is directed upward in the reversing unit RT1, and the top surface of the substrate W is directed upward in the reversing unit RT2.

Then, the support member 35a is lowered by the cylinder 37a as shown in FIG. 6(f). Thus, the first movable plate 36a is lowered, and the distance between the first movable plate 36a and the fixed plate 32 is lengthened. Therefore, the substrate W is held by the support pins 39c on the first movable plate 36a.

In this state, the hand MRH2 of the main robot MR advances below the first movable plate 36a as shown in FIG. 7(g). The hand MRH2 is subsequently lifted as shown in FIG. 7(h). In this case, the claw portions H12 of the hand MRH2 are lifted through the notch region between the central support portion 361a and the side portions 362a, 363a of the first movable plate 36a as shown in FIG. 7(i). Thus, the substrate W is received by the hand MRH2. Then, the hand MRH2 withdraws from the reversing unit RT1, RT2, and the substrate W is carried out of the reversing unit RT1, RT2.

Note that FIGS. 5-7 show the case where the substrate W is carried in with the first movable plate 36a positioned above the fixed plate 32 and carried out with the second movable plate 36b positioned above the fixed plate 32. However, after the substrate W is carried out with the second movable plate 36b positioned above the fixed plate 32, the substrate W is carried in with the second movable plate 36b positioned above the fixed plate 32, and the substrate W is subsequently carried out with the first movable plate 36a positioned above the fixed plate 32 as described later.

In the case, the second support member 35b is lowered by the cylinder 37b, so that the substrate W is held by the support pins 39d on the second movable plate 36b and the support pins 39b on the fixed plate 32. The first movable plate 36a, the fixed plate 32 and the second movable plate 36b are reversed by the rotary actuator 38 in this state, and the substrate W is reversed. Then, the second support member 35b is lowered by the cylinder 37b, so that the substrate W is supported by the support pins 39d, and the substrate W placed on the support pins 39d is subsequently carried out by the hand MRH2.

(1-6) Carrying in and out the Substrate by the Main Robot

Next, the operations of the main robot MR from carrying the substrate W out of the reversing unit RT1, RT2 to carrying the new substrate W into the reversing unit RT1, RT2 will be described.

Figure 8:
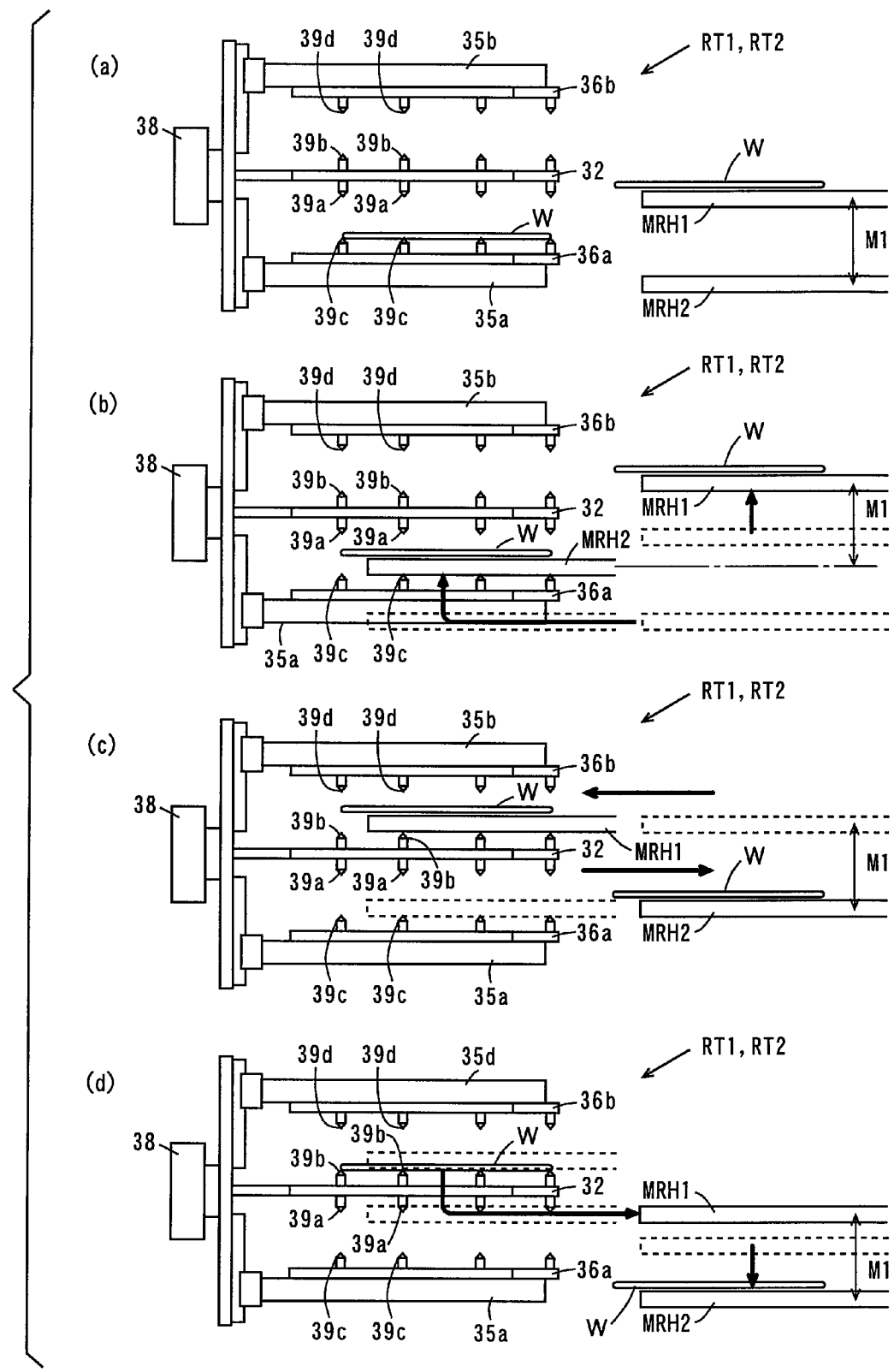
FIG. 8 is a diagram showing carrying in and out operations of a substrate by the main robot.

FIG. 8 is a diagram for explaining the operations of carrying in and out the substrate W by the main robot MR. As described above, the main robot MR carries the substrate W after the reversing out of the reversing unit RT1, RT2 by the hand MRH2 and carries the substrate before the reversing into the reversing unit RT1, RT2 by the hand MRH1. Thus, the hand MRH1 of the main robot MR holds the substrate W before the reversing and the hand MRH2 does not hold the substrate W as shown in FIG. 8(a) immediately before the substrate W is carried into and out of the reversing units RT1, RT2.

As shown in FIG. 8(b), the hand MRH2 advances and is lifted, so that the substrate Won as the support pins 39c is received by the hand MRH2. Here, since the difference M1 in height between the hand MRH1 and the hand MRH2 is maintained constant, the hand MRH1 is lifted in accordance with the upward movement of the hand MRH2.

Next, the hand MRH1 advances while the hand MRH2 withdraws with the heights of the hands MRH1 and MRH2 maintained constant as shown in FIG. 8(c). Here, the distance M2 (FIG. 4) between the first movable plate 36a and the fixed plate 32 and the distance M3 (FIG. 4) between the second movable plate 36b and the fixed plate 32 are set to be substantially equal to the difference M1 in height between the hand MRH1 and the hand MRH2 in the present embodiment. Therefore, when the hand MRH2 is positioned at a level in between the first movable plate 36a and the fixed plate 32, the hand MRH1 is positioned at a level in between the second movable plate 36b and the fixed plate 32. Accordingly, the hand MRH1 advances to move to a position in between the second movable plate 36b and the fixed plate 32.

The hand MRH1 is subsequently lowered and withdraws as shown in FIG. 8(d). Accordingly, the substrate W is placed on the support pins 39b. Here, the hand MRH2 is lowered in accordance with the downward movement of the hand MRH1.

In this way, the substrate W is carried into and out of the reversing unit RT1, RT2 by the main robot MR. Thereafter, the reversing unit RT1, RT2 reverses the substrate W that is subsequently carried therein. That is, the substrate W is carried into and out of the reversing unit RT1, RT2 alternately in the state where the first movable plate 36a is positioned above the fixed plate 32 and the state where the second movable plate 36b is positioned above the fixed plate 32.

Figure 9:
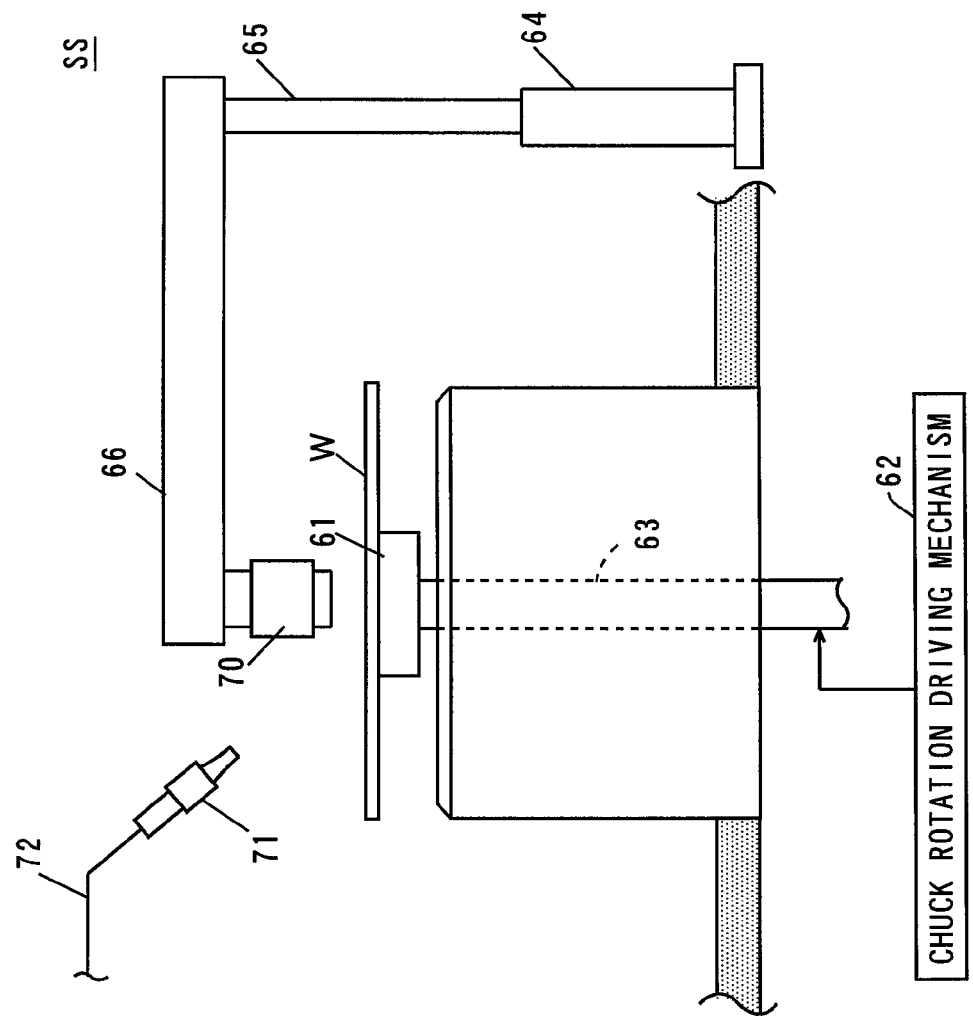
FIG. 9 is a diagram showing a configuration of a top surface cleaning unit.
Figure 10:
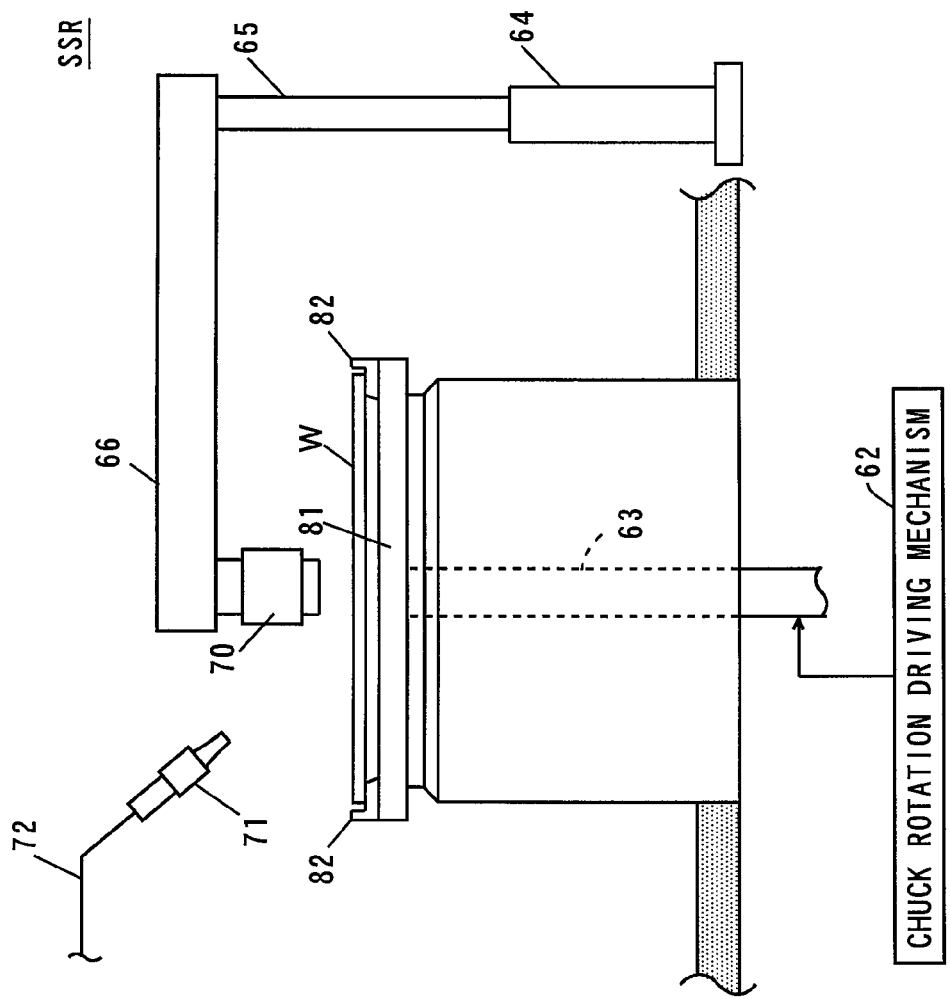
FIG. 10 is a diagram showing a configuration of a back surface cleaning unit.

(1-7) Details of the Top Surface Cleaning Unit and the Back Surface Cleaning Unit Next, the top surface cleaning unit SS and the back surface cleaning unit SSR shown in FIG. 1 will be described. FIG. 9 is a diagram for explaining the configuration of the top surface cleaning unit SS, and FIG. 10 is a diagram for explaining the configuration of the back surface cleaning unit SSR. In the top surface cleaning unit SS shown in FIG. 9 and the back surface cleaning unit SSR shown in FIG. 10, a cleaning processing of the substrate W by use of a brush (hereinafter referred to as the scrub cleaning processing) is performed.

First, details of the top surface cleaning unit SS will be described by use of FIG. 9. As shown in FIG. 9, the top surface cleaning unit SS includes a spin chuck 61 for rotating the substrate W around a vertical axis passing through the center of the substrate W while holding the substrate W horizontally. The spin chuck 61 is secured to the upper end of a rotation shaft 63 that is rotated by a chuck rotation driving mechanism 62.

As described above, the substrate W with the top surface thereof directed upward is carried into the top surface cleaning unit SS. When the scrub cleaning processing and a rinsing processing are performed, the back surface of the substrate W is held by suction on the spin chuck 61.

A motor 64 is provided outside the spin chuck 61. A rotation shaft 65 is connected to the motor 64. An arm 66 is coupled to the rotation shaft 65 so as to extend in a horizontal direction, and a substantially cylindrical brush cleaner 70 is provided on the tip of the arm 66. In addition, above the spin chuck 61, a liquid discharge nozzle 71 is provided for supplying a cleaning liquid or a rinse liquid (pure water) onto the top surface of the substrate W held by the spin chuck 61. A supply pipe 72 is connected to the liquid discharge nozzle 71, and the cleaning liquid and the rinse liquid are selectively supplied to the liquid discharge nozzle 71 through this supply pipe 72.

In the scrub cleaning processing, the motor 64 rotates the rotation shaft 65. Thus, the arm 66 turns within a horizontal plane, and the brush cleaner 70 moves between a position outside the substrate W and a position above the center of the substrate W, centered around the rotation shaft 65. A lifting mechanism (not shown) is provided in the motor 64. The lifting mechanism lifts and lowers the brush cleaner 70 in the position outside the substrate W and the position above the center of the substrate W by lifting and lowering the rotation shaft 65.

When the scrub cleaning processing is started, the substrate W with the top surface thereof directed upward is rotated by the spin chuck 61. Moreover, the cleaning liquid or the rinse liquid is supplied to the liquid discharge nozzle 71 through the supply pipe 72. Thus, the cleaning liquid or the rinse liquid is supplied onto the top surface of the substrate W that rotates. In this state, the brush cleaner 70 is swung and moved up and down by the rotation shaft 65 and the arm 66. Accordingly, the scrub cleaning processing is performed on the top surface of the substrate W. Note that since the suction-type spin chuck 61 is used in the top surface cleaning unit SS, the peripheral portion and the outer circumference of the substrate W can be simultaneously cleaned.

Next, for the back surface cleaning unit SSR, different points from the top surface cleaning unit SS shown in FIG. 9 will be described by use of FIG. 10. As shown in FIG. 10, the back surface cleaning unit SSR includes a mechanical type spin chuck 81 that holds the outer circumference of the substrate W instead of the suction-type spin chuck 61 that holds the lower surface of the substrate W by vacuum suction. When the scrub cleaning processing and the rinsing processing are performed, the substrate W is rotated while being maintained in a horizontal posture with the peripheral portion of the lower surface of the substrate W and the outer circumference of the substrate W held by the spin holding pins 82 on the spin chuck 61.

As described above, the substrate W with the back surface thereof directed upward is carried into the back surface cleaning unit SSR. Therefore, the substrate W is held by the spin chuck 81 with the back surface thereof directed upward. Then, a scrub cleaning processing that is similar to the above described scrub cleaning processing is performed on the back surface of the substrate W.

(1-8) Effects of the First Embodiment

In the first embodiment, when the substrate W after the reversing is carried out of the reversing unit RT1, RT2 by withdrawing the hand MRH2 of the main robot MR, the hand MRH1 of the main robot MR is advanced at the constant level without being vertically moved, so that the substrate W before the reversing can be carried into the reversing unit RT1, RT2.

In this case, since the heights of the hands MRH1, MRH2 are not required to be adjusted during the period from carrying the substrate W out of the reversing unit RT1, RT2 to carrying the substrate W into the reversing unit RT1, RT2, the substrate W can be carried into and out of the reversing unit RT1, RT2 quickly. Accordingly, the throughput in the substrate processing apparatus 100 can be improved.

In addition, since the striped notch regions are formed in the first movable plate 36a, the second movable plate 36b and the fixed plate 32 of the reversing unit RT1, RT2, the hands MRH1, MRH2 of the main robot MR can vertically move through the notch regions in the first embodiment.

In this case, even though the lengths of the support pins 39a, 39b, 39c, 39d are short, the hands MRH1, MRH2 can place the substrate W on the support pins 39a, 39b, 39c, 39d without coming into contact with the first movable plate 36a, the second movable plate 36b and the fixed plate 32 by being lowered through the notch regions. Moreover, even though the lengths of the support pins 39a, 39b, 39c, 39d are short, the hands MRH1, MRH2 can receive the substrate W placed on the support pins 39a, 39b, 39c, 39d without coming into contact with the first movable plate 36a, the second movable plate 36b and the fixed plate 32 by being lifted through the notch regions. Accordingly, the reversing unit RT1, RT2 can be reduced in size.

Furthermore, the substrate W held by the reversing unit RT1 is in the state where the top surface thereof is directed upward when the substrate W is in a position higher than the horizontal axis HA and in the state where the back surface thereof is directed upward when the substrate W is in a position lower than the horizontal axis HA in the first embodiment. Moreover, the substrate W held by the reversing unit RT2 is in the state where the back surface thereof is directed upward when the substrate W is in the position higher than the horizontal axis HA and in the state where the top surface thereof is directed upward when the substrate W is in the position lower than the horizontal axis HA.

This makes it possible to determine which surface of the substrate W is directed upward by seeing if the substrate W is at the higher position than the horizontal axis HA or at the lower position than the horizontal axis HA. Thus, determination as to which surface of the substrate W held by the reversing unit RT1, RT2 is directed upward can be made instantaneously, even though the operation of the substrate processing apparatus 100 stops due to the electric outage or the like, for example.

(2) Second Embodiment

For a substrate processing apparatus according to a second embodiment of the present invention, different points from the substrate processing apparatus according to the first embodiment will be described.

(2-1) Configuration of the Substrate Processing Apparatus

FIG. 11(a) is a plan view of the substrate processing apparatus according to the second embodiment of the present invention, and FIG. 11(b) is a diagram that schematically shows the sectional view taken along the line B-B of FIG. 11(a). As shown in FIG. 11(a) and FIG. 11(b), the substrate processing apparatus 100a according to the second embodiment includes each two of the reversing units RT1, RT2 and the substrate platforms PASS1, PASS2.

(2-2) Operations of the Main Robot

Figure 11:
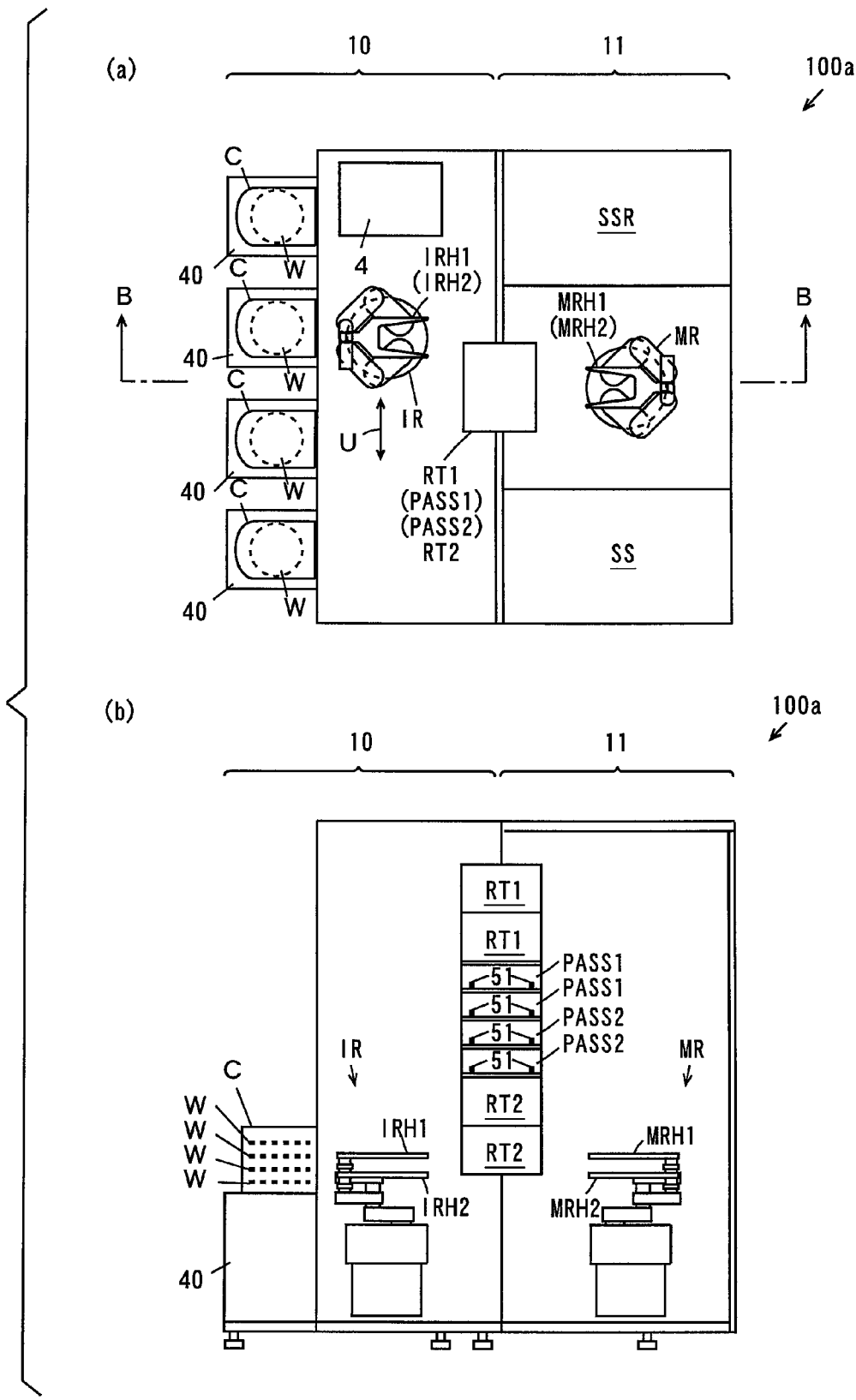
FIG. 11 is a diagram showing a configuration of a substrate processing apparatus according to a second embodiment of the present invention.

Next, a summary of the operations of the main robot MR in the second embodiment will be described by referring to FIG. 11. The main robot MR receives the unprocessed substrates W from the two substrate platforms PASS1 by the hands MRH1, MRH2, respectively. Then, the main robot MR sequentially carries the two substrates W held by the hands MRH1, MRH2 into the two top surface cleaning units SS. Next, the main robot MR sequentially carries the two substrates W after the top surface cleaning processing out of the two top surface cleaning units SS by the hands MRH1, MRH2.

Then, the main robot MR carries the two substrates W held by the hands MRH1, MRH2 into one of the reversing units RT1. The main robot MR subsequently carries the two substrates W with their back surfaces directed upward out of the other one of the reversing unit RT1 by the hands MRH1, MRH2. Next, the main robot MR sequentially carries the two substrates W held by the hands MRH1, MRH2 into the two back surface cleaning units SSR. Then, the main robot MR sequentially carries the two substrates W after the back surface cleaning processing out of the two back surface cleaning units SSR by the hands MRH1, MRH2.

The main robot MR subsequently carries the two substrates W held by the hands MRH1, MRH2 into one of the reversing units RT2. Next, the main robot MR carries the two substrates W with their top surfaces directed upward from the other one of the reversing units RT2 by the hands MRH1, MRH2. Then, the main robot MR places the two substrates W held by the hands MRH1, MRH2 on the two substrate platforms PASS2, respectively. The main robot MR performs a series of such operations successively.

(2-3) Operations of the Reversing Units

Figure 12:
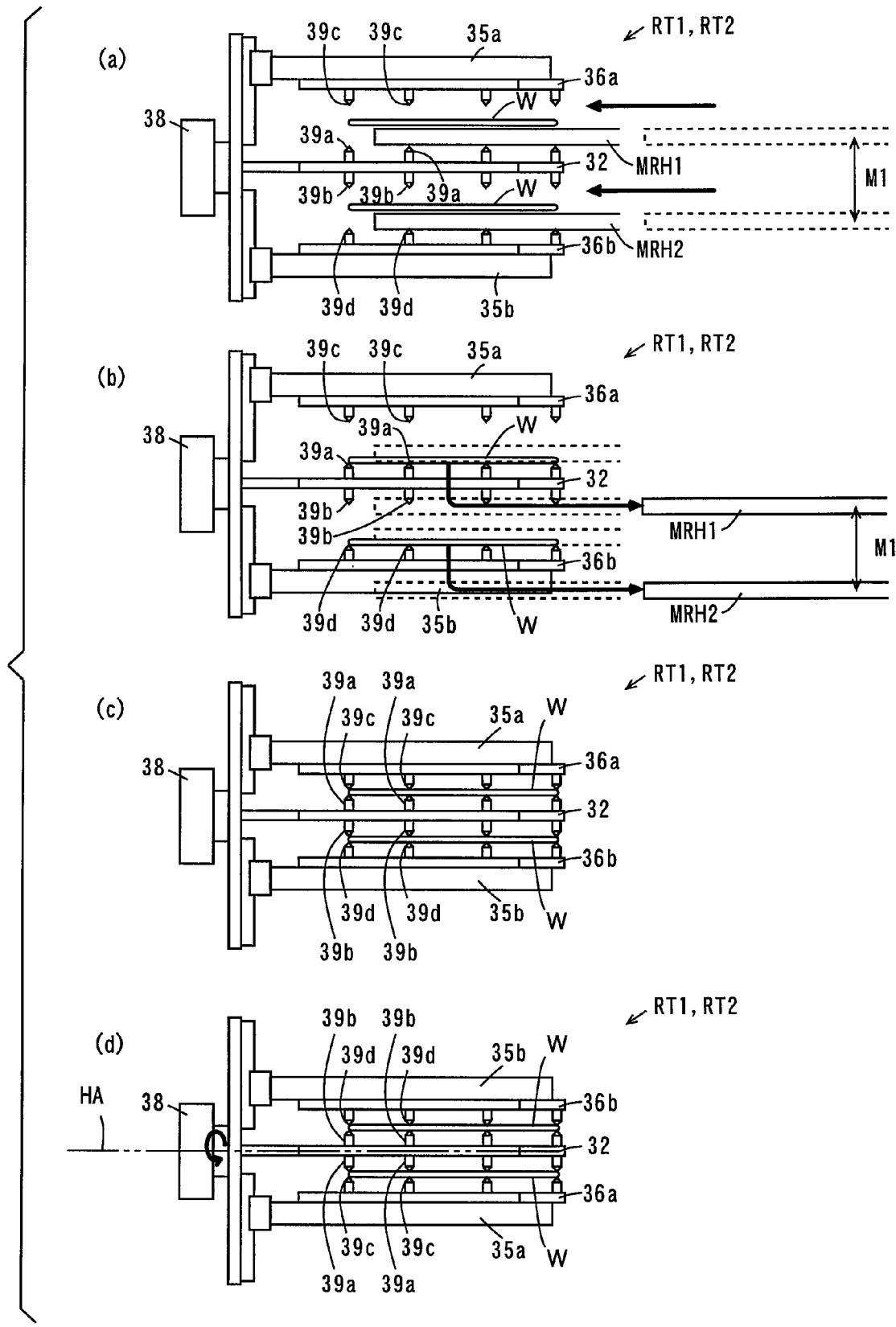
FIG. 12 is a diagram showing operations of a reversing unit in the second embodiment.
Figure 13:
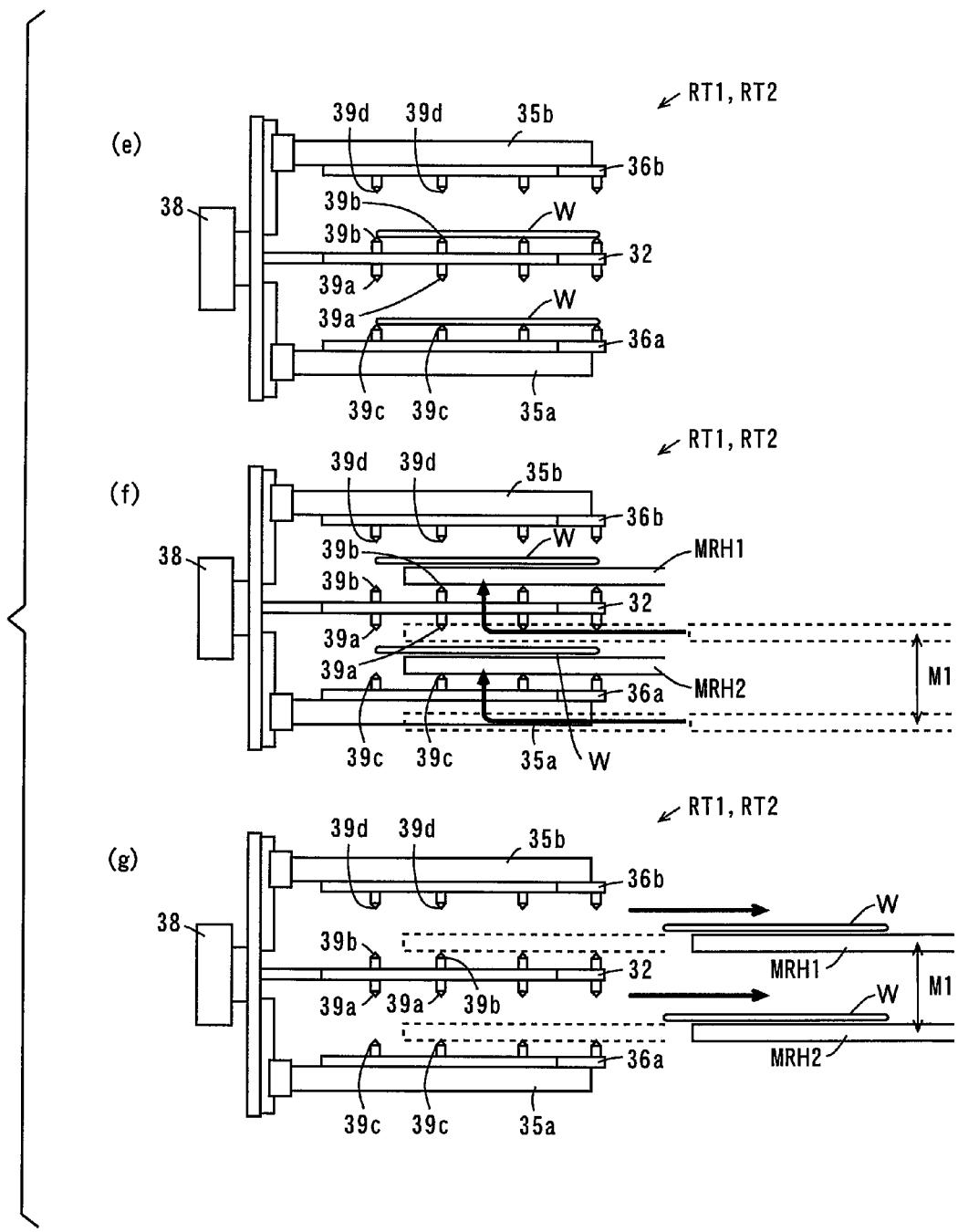
FIG. 13 is diagram showing the operations of the reversing unit in the second embodiment.

Next, operations of the reversing units RT1, RT2 will be explained. FIG. 12 and FIG. 13 are diagrams for use in explaining the operations of the reversing units RT1, RT2. As shown in FIG. 12(a), the hands MRH1, MRH2 simultaneously advance between the first movable plate 36a and the fixed plate 32 and between the second movable plate 36b and the fixed plate 32, respectively. Then, as shown in FIG. 12(b), the hands MRH1, MRH2 are simultaneously lowered and withdraw. Thus, the substrates W are placed on the support pins 39a, 39d. In this case, the substrates W with their top surfaces directed upward are placed on the support pins 39a, 39d in the reversing units RT1, and the substrates W with their back surfaces directed upward are placed on the support pins 39a, 39d in the reversing units RT2.

Then, the support member 35a is lowered by the cylinder 37a (FIG. 4(a)) while the support member 35b is lifted by the cylinder 37b (FIG. 4(a)) as shown in FIG. 12(c). Accordingly, the one substrate W is held by the support pins 39c on the first movable plate 36a and the support pins 39a on the fixed plate 32, and the other substrate W is held by the support pins 39d on the second movable plate 36b and the support pins 39b on the fixed plate 32.

In this state, the first movable plate 36a, the fixed plate 32 and the second movable plate 36b are integrally rotated by the rotary actuator 38 around the horizontal axis HA by 180 degrees as shown in FIG. 12(d). Thus, the substrate W held by the support pins 39a, 39c and the substrate W held by the support pins 39b, 39d are reversed. In this case, the back surfaces of the substrates W are directed upward in the reversing unit RT1, and the top surfaces of the substrates W are directed upward in the reversing unit RT2.

Next, the support member 35a is lowered by the cylinder 37a while the support member 35b is lifted by the cylinder 37b as shown in FIG. 13(e). Accordingly, the first movable plate 36a is lowered while the second movable plate 36b is lifted. Therefore, the one substrate W is held by the support pins 39c on the first movable plate 36a, and the other substrate W is held by the support pins 39b on the fixed plate 32.

In this state, the hands MRH1, MRH2 advance below the substrate W held by the support pins 39b and the substrate W held by the support pins 39c, respectively, and are lifted as shown in FIG. 13(f). Thus, the substrate W supported by the support pins 39b is received by the hand MRH1 and the substrate W supported by the support pins 39c is received by the hand MRH2. Thereafter, as shown in FIG. 13(g), the hands MRH1, MRH2 simultaneously withdraw, so that the two substrates W are carried out of the reversing units RT1, RT2.

(2-4) Effects of the Second Embodiment

In the second embodiment, the two substrates W are simultaneously carried into the reversing units RT1, RT2 by the hands MRH1, MRH2 of the main robot MR and simultaneously reversed by the reversing units RT1, RT2. Thereafter, the two substrates W are simultaneously carried out of the reversing units RT1, RT2 by the hands MRH1, MRH2 of the main robot MR.

In this case, the substrates W can be carried into and out of the reversing units RT1, RT2 quickly while the plurality of substrates W can be reversed efficiently. Accordingly, the throughput in the substrate processing apparatus 100a can be improved.

(3) Third Embodiment

For a substrate processing apparatus according to a third embodiment of the present invention, different points from the substrate processing apparatus according to the first embodiment will now be described. The substrate processing apparatus according to the third embodiment includes reversing units RT1a, RT2a that will be shown below instead of the reversing units RT1, RT2.

Figure 14:
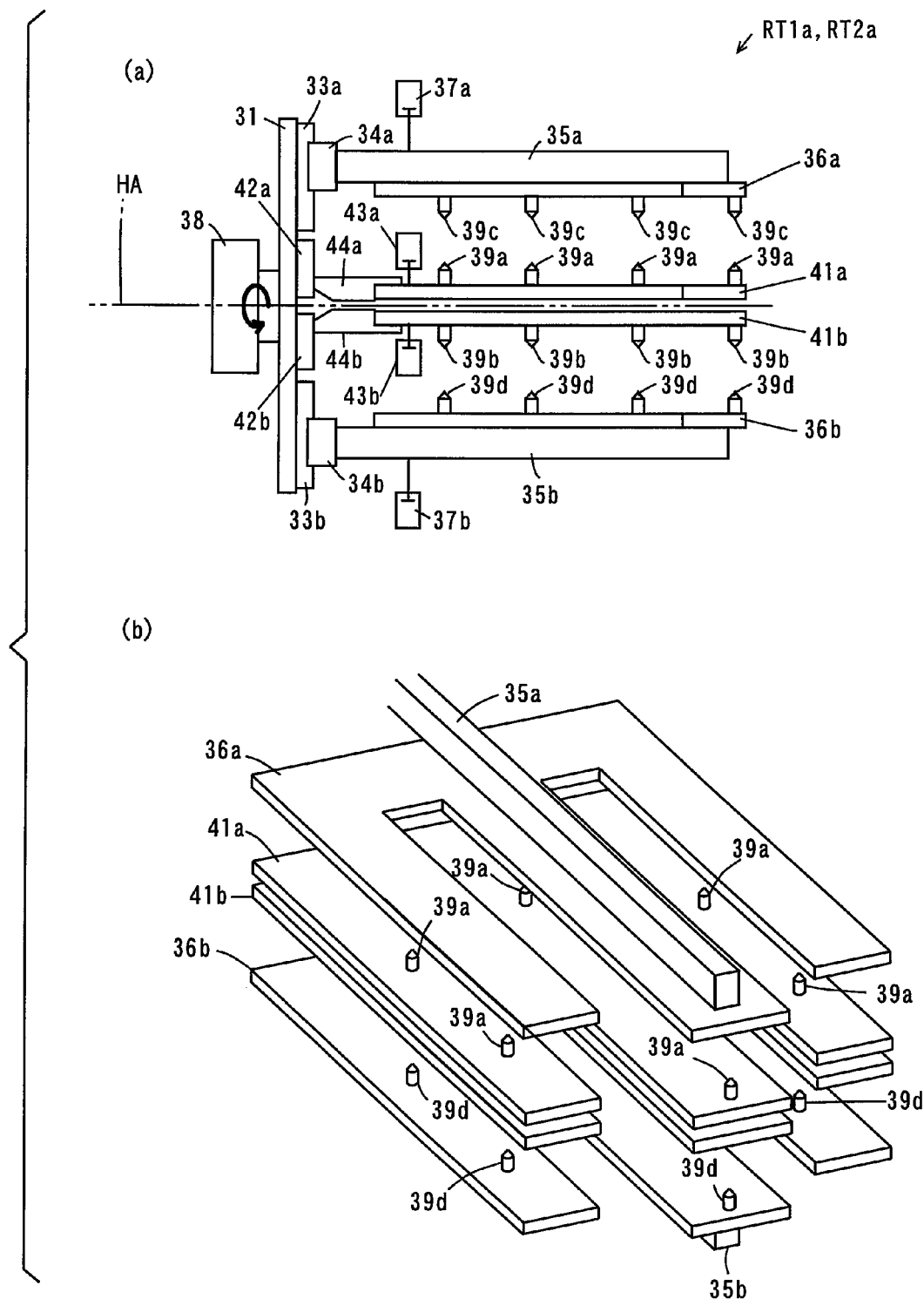
FIG. 14 is a diagram showing a configuration of a reversing unit in a third embodiment.

FIG. 14(a) is a side view of the reversing unit RT1a, RT2a and FIG. 14(b) is a perspective view of the reversing unit RT1a, RT2a. For the reversing unit RT1a, RT2a, different points from the reversing unit RT1, RT2 will be explained by use of FIG. 14(a) and FIG. 14(b). Note that the reversing units RT1a, RT2a have the same configuration.

As shown in FIG. 14(a) and FIG. 14(b), the reversing unit RT1a, RT2a includes a third movable plate 41a, a fourth movable plate 41b, a pair of linear guides 42a, 42b and a pair of cylinders 43a, 43b instead of the fixed plate 32.

The third movable plate 41a is provided so as to face the first movable plate 36a and slidably attached to the linear guide 42a by a coupling member 44a. The fourth movable plate 41b is provided so as to face the second movable plate 36b and slidably attached to the linear guide 42b by a coupling member 44b. The third movable plate 41a and the fourth movable plate 41b have the same shape as those of the first movable plate 36a and the second movable plate 36b, respectively.

The linear guides 42a, 42b extend in a direction vertical to the third movable plate 41a and the fourth movable plate 41b, respectively. The third movable plate 41a is moved up and down along the linear guide 42a by the cylinder 43a, and the fourth movable plate 41b is moved up and down along the linear guide 42b by the cylinder 43b. In addition, the plurality of support pins 39a are provided on one surface of the third movable plate 41a facing the first movable plate 36a, and the plurality of support pins 39b are provided on one surface of the fourth movable plate 41b facing the second movable plate 36b.

Note that the respective distances between the first movable plate 36a and the third movable plate 41a, the second movable plate 36b and the fourth movable plate 41b, the third movable plate 41a and the fourth movable plate 41b can be arbitrarily set within a range where the distance between the tips of the support pins 39c and the tips of the support pins 39d is larger than the difference M1 in height between the hand MRH1 and the hand MRH2 and the distance between the tips of the support pins 39a and the tips of the support pins 39b is smaller than the difference M1 in height between the hand MRH1 and the hand MRH2 in the state where the third movable plate 41a and the second movable plate 36b are farthest away from each other while the fourth movable plate 41b and the first movable plate 36a are farthest away from each other.

In the reversing units RT1a, RT2a, the first movable plate 36a is moved down by the cylinder 37a and the third movable plate 41a are moved up by the cylinder 43a so that the first movable plate 36a and the third movable plate 41a are close to each other for holding the substrate W carried in between the first movable plate 36a and the third movable plate 41a. Thus, the substrate W is held by the support pins 39a, 39c. Moreover, the first movable plate 36a is moved up by the cylinder 37a and the third movable plate 41a is moved down by the cylinder 43a so that the first movable plate 36a and the third movable plate 41a are away from each other for releasing the holding of the substrate W by the support pins 39a, 39c.

Furthermore, the second movable plate 36b is moved up by the cylinder 37b and the fourth movable plate 41b is moved down by the cylinder 43b so that the second movable plate 36b and the fourth movable plate 41b are close to each other for holding the substrate W carried in between the second movable plate 36b and the fourth movable plate 41b. Moreover, the second movable plate 36b is moved down by the cylinder 37b and the fourth movable plate 41b is moved up by the cylinder 43b so that the second movable plate 36b and the fourth movable plate 41b are away from each other for releasing the holding of the substrate W held by the support pins 39b, 39d.

Similarly to the first embodiment, when the substrate W after the reversing is carried out of the reversing unit RT1a, RT2a by withdrawing the hand MRH2 of the main robot MR, the hand MRH1 of the main robot MR is advanced at the constant level without being vertically moved, so that the substrate W before the reversing can be carried into the reversing unit RT1a, RT2a in the third embodiment.

Accordingly, the substrate W can be carried into and out of the reversing unit RT1a, RT2a quickly since it is not necessary to adjust the heights of the hands MRH1, MRH2 during the period from carrying the substrate W out of the reversing unit RT1a, RT2a to carrying the substrate W into the reversing unit RT1a, RT2a. Thus, the throughput in the substrate processing apparatus can be improved.

In addition, each of the first movable plate 36a, the second movable plate 36b, the third movable plate 41a and the fourth movable plate 41b can be driven independently in the third embodiment. This allows the space between the holding position of the substrate W by the support pins 39a, 39c and the holding position of the substrate W by the support pins 39b, 39d to be arbitrarily adjusted.

Note that the reversing units RT1a, RT2a may be used instead of the reversing units RT1, RT2 in the above described second embodiment.

(4) Other Embodiments

While the back surface cleaning processing is performed on the substrate W after the top surface cleaning processing in the above described first to third embodiments, the invention is not limited to this and the top surface cleaning processing of the substrate W may be performed after the back surface cleaning processing. In this case, the substrate W is reversed by the reversing unit RT1 (or the reversing unit RT1a) so that the back surface thereof is directed upward before the back surface cleaning processing is performed on the substrate W. After the back surface cleaning processing is performed on the substrate W, the substrate W is reversed by the reversing unit RT2 (or the reversing unit RT2a) so that the top surface thereof is directed upward. Thereafter, the top surface cleaning processing is performed on the substrate W.

Furthermore, while the top surface and the back surface of the substrate W are cleaned by use of the brush in the top surface cleaning unit SS and the back surface cleaning unit SSR in the above described first to third embodiments, the present invention is not limited to this and the top surface and the back surface of the substrate W may be cleaned by use of a chemical liquid.

Moreover, while the substrate W before the back surface cleaning processing is reversed by the reversing unit RT1 (or the reversing unit RT1a) and the substrate W after the back surface cleaning processing is reversed by the reversing unit RT2 (or the reversing unit RT2a) in the above described first to third embodiments, the present invention is not limited to this and the substrate W before the back surface cleaning processing may be reversed by the reversing unit RT2 (or the reversing unit RT2a) and the substrate W after the back surface cleaning processing may be reversed by the reversing unit RT1 (or the reversing unit RT1a).

In addition, while the hand MRH1 of the main robot MR carries the substrate W into the reversing units RT1, RT2 (or the reversing units RT1a, RT2a) and the hand MRH2 of the main robot MR carries the substrate W out of the reversing units RT1, RT2 (or the reversing units RT1a, RT2a) in the above described first and third embodiments, the hand MRH2 of the main robot MR may carry the substrate W into the reversing units RT1, RT2 (or the reversing units RT1a, RT2a) and the hand MRH1 of the main robot MR may carry the substrate W out of the reversing units RT1, RT2 (or the reversing units RT1a, RT2a).

In this case, the substrate W before the reversing is held below the horizontal axis HA and the substrate W after the reversing is held above the horizontal axis HA in the reversing units RT1, RT2 (the reversing units RT1a, RT2a).

Moreover, while the main robot MR carries the substrate W after the reversing out of the reversing units RT1, RT2 (or the reversing units RT1a, RT2a) and subsequently carries the substrate W before the reversing into the reversing units RT1, RT2 (or the reversing units RT1a, RT2a) in the first and third embodiments, the present invention is not limited to this and the main robot MR may carry the substrate W before the reversing into the reversing units RT1, RT2 (or the reversing units RT1a, RT2a) and subsequently carry the substrate W after the reversing out of the reversing units RT1, RT2 (or the reversing units RT1a, RT2a).

Furthermore, while the substrate W before the back surface cleaning processing is reversed in the reversing unit RT1 (or the reversing unit RT1a) and the substrate W after the back surface cleaning processing is reversed in the reversing unit RT2 (or the reversing unit RT2a) in the above described first to third embodiments, the substrate W before the back surface cleaning processing and the substrate W after the back surface cleaning processing may be reversed in a common reversing unit.

In addition, while the support pins 39a, 39b, 39c, 39d have the same length in the above described first and second embodiments, the respective lengths of the support pins 39a, 39b, 39c, 39d can be arbitrarily set within the range where the distance between the tips of the support pins 39c and the tips of the support pins 39d is larger than the difference M1 in height between the hand MRH1 and the hand MRH2 and the distance between the tips of the support pins 39a and the tips of the support pins 39b is smaller than the difference M1 in height between the hand MRH1 and the hand MRH2 in the state where the first movable plate 36a and the second movable plate 36b are farthest away from the fixed plate 32.

Similarly, the respective lengths of the support pins 39a, 39b, 39c, 39d can be arbitrarily set within the range where the distance between the tips of the support pins 39c and the tips of the support pins 39d are larger than the difference M1 in height between the hand MRH1 and the hand MRH2 and the distance between the tips of the support pins 39a and the tips of the support pins 39b is smaller than the difference M1 in height between the hand MRH1 and the hand MRH2 in the state where the third movable plate 41a and the second movable plate 36b are farthest away from each other while the fourth movable plate 41b and the first movable plate 36a are farthest away from each other in the above described third embodiment.

Moreover, the fixed plate 32 is secured to the support plate 31 and the first movable plate 36a and the second movable plate 36b are provided so as to be movable with respect to the support plate 31 in the first embodiment, the first movable plate 36a and the second movable plate 36b may be secured to the support plate 31 and the fixed plate 32 may be provided so as to be movable with respect to the support plate 31.

Furthermore, while multi-joint type transport robots that linearly move their hands forward and backward by moving their joints are used as the indexer robot IR and the main robot MR in the above described first to third embodiments, the present invention is not limited to this and linear-type transport robots that move their hands forward and backward by linearly sliding them with respect to the substrate W may be used.

In addition, the order of the operations of the indexer robot IR and the main robot MR may be suitably changed depending on the processing speeds or the like of the reversing units RT1, RT2, the top surface cleaning unit SS and the back surface cleaning unit SSR.

Moreover, the respective numbers of the reversing units RT1, RT2 (or the reversing units RT1a, RT2a), the top surface cleaning unit SS, the back surface cleaning unit SSR and the substrate platforms PASS1, PASS2 may be suitably changed depending on their processing speeds or the like.

(5) Correspondences Between Structural Elements in Claims and Elements in the Embodiments In the following paragraphs, non-limiting examples of correspondences between various elements recited in the claims below and those described above with respect to various embodiments of the present invention are explained.

In the above described embodiment, the reversing units RT1, RT2, RT1a, RT2a are examples of a reversing device, the fixed plate 32, the first movable plate 36a, the support pins 39a, 39c, the cylinders 37a, 43a and the third movable plate 41a are examples of a first holding mechanism, the fixed plate 32, the second movable plate 36b, the support pins 39b, 39d, the cylinders 37b, 43b and the fourth movable plate 41b are examples of a second holding mechanism, the support plate 31 is an example of a support member, the rotary actuator 38 is an example of a rotating device, the fixed plate 32, the third movable plate 41a and the fourth movable plate 41b are examples of a common reverse holding member, the first movable plate 36a is an example of a first reverse holding member, the second movable plate 36b is an example of a second reverse holding member, the support pin 39a is an example of a first supporter, the support pin 39c is an example of a second supporter, the support pin 39b is an example of a third supporter, the support pin 39d is an example of a fourth supporter, the cylinders 37a, 43a are examples of a first driving mechanism and the cylinders 37b, 43b are examples of a second driving mechanism.

Furthermore, the main robot MR is an example of a transport device, the hand MRH1 is an example of a first transport holder, the hand MRH2 is an example of a second transport holder, the claw portions H11, H12 are examples of a holding portion, the third movable plate 41a is an example of a third reverse holding member, the fourth movable plate 41b is an example of a fourth reverse holding member, the back surface cleaning unit SSR is an example of a first cleaning processing unit and the top surface cleaning unit SS is an example of a second cleaning processing unit.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A reversing device comprising:
   a first holding mechanism configured for holding a substrate in a state vertical to a first axis;
   a second holding mechanism configured for holding a substrate in the state vertical to said first axis;
   a supporting member that supports said first and second holding mechanisms so that said first and second holding mechanisms overlap with each other in a direction of said first axis; and
   a rotating device that integrally rotates said supporting member together with said first and second holding mechanisms around a second axis substantially vertical to said first axis; wherein
   said first holding mechanism is configured to hold the substrate independently from said second holding mechanism, and said second holding mechanism is configured to hold the substrate independently from said first holding mechanism;
   wherein
   said first and second holding mechanisms include a common reverse holding member having one surface and the other surface that are vertical to said first axis,
   said first holding mechanism includes
   a plurality of first supporters that are provided on said one surface of said common reverse holding member and support a periphery of the substrate, a first reverse holding member provided so as to face said one surface of said common reverse holding member, a plurality of second supporters that are provided on a surface of said first reverse holding member facing said common reverse holding member and support the periphery of the substrate, and a first driving mechanism that moves at least one of said first reverse holding member and said common reverse holding member so that said first reverse holding member and said common reverse holding member are selectively shifted between a state where said first reverse holding member and said common reverse holding member are spaced apart from each other in the direction of said first axis and a state where said first reverse holding member and said common reverse holding member are close to each other, and said second holding mechanism includes a plurality of third supporters that are provided on said other surface of said common reverse holding member and support the periphery of the substrate, a second reverse holding member provided so as to face said other surface of said common reverse holding member, a plurality of fourth supporters that are provided on a surface of said second reverse holding member facing said common reverse holding member and support the periphery of the substrate, and a second driving mechanism that moves at least one of said second reverse holding member and said common reverse holding member so that said second reverse holding member and said common reverse holding member are selectively shifted between a state where said second reverse holding member and said common reverse holding member are spaced apart from each other in the direction of said first axis and a state where said second reverse holding member and said common reverse holding member are close to each other.

2. The reversing device according to claim 1, wherein each of said first and second holding mechanisms hold the substrate carried therein by each of the first and second transport holders of a transport device, and a distance between a holding position of the substrate by said first holding mechanism and a holding position of the substrate by said second holding mechanism is substantially equal to a distance between a holding position of the substrate by said first transport holder of said transport device and a holding position of the substrate by said second transport holder.

3. The reversing device according to claim 2, wherein said common reverse holding member, said first reverse holding member and said second reverse holding member have notch regions through which said first and second transport holders of said transport device can pass in the direction of said first axis.

4. A substrate processing apparatus that performs processing on a substrate having a top surface and a back surface, comprising:

a reversing device that reverses said top surface and said back surface of the substrate; and a transport device that has first and second transport holders and carries the substrate into and out of said reversing device, wherein said reversing device includes a first holding mechanism configured for holding the substrate in a state vertical to a first axis, a second holding mechanism configured for holding the substrate in the state vertical to said first axis, a supporting member that supports said first and second holding mechanisms so that said first and second holding mechanisms overlap with each other in a direction of said first axis, and a rotating device that integrally rotates said support member together with said first and second holding mechanisms around a second axis that is substantially vertical to said first axis, wherein said first holding mechanism is configured to hold the substrate independently from said second holding mechanism, and said second holding mechanism is configured to hold the substrate independently from said first holding mechanism;

wherein said first and second holding mechanisms include a common reverse holding member having one surface and the other surface that are vertical to said first axis, said first holding mechanism includes a plurality of first supporters that are provided on said one surface of said common reverse holding member and support a periphery of the substrate, a first reverse holding member provided so as to face said one surface of said common reverse holding member, a plurality of second supporters provided on a surface of said first reverse holding member facing said common reverse holding member and support the periphery of the substrate, and a first driving mechanism that moves at least one of said first reverse holding member and said common reverse holding member so that said first reverse holding member and said common reverse holding member are selectively shifted between a state where said first reverse holding member and said common reverse holding member are spaced apart from each other in the direction of said first axis and a state where said first reverse holding member and said common reverse holding member are close to each other, and said second holding mechanism includes a plurality of third supporters provided on said other surface of said common reverse holding member and support the periphery of the substrate, a second reverse holding member provided so as to face said other surface of said common reverse holding member, a plurality of fourth supporters provided on a surface of said second reverse holding member facing said common reverse holding member and support the periphery of the substrate, and a second driving mechanism that moves at least one of said second reverse holding member and said common reverse holding member so that said second reverse holding member and said common reverse holding member are selectively shifted between a state where said second reverse holding member and said common reverse holding member are spaced apart from each other in the direction of said first axis and a state where said second reverse holding member and said common reverse holding member are close to each other.

5. The substrate processing apparatus according to claim 4, wherein a distance between a holding position of the substrate by said first holding mechanism and a holding position of the substrate by said second holding mechanism is substantially equal to a distance between a holding position of the substrate by said first transport holder of said transport device and a holding position of the substrate by said second transport holder.

6. The substrate processing apparatus according to claim 4, wherein said common reverse holding member, said first reverse holding member and said second reverse holding member have notch regions through which said first and second transport holders of said transport device can pass in the direction of said first axis.

7. A substrate processing apparatus according to claim 6, wherein
said transport device includes an advance/withdrawing mechanism that advances and withdraws said first and second transport holders,
each of said first and second transport holders has a plurality of holding portions extending in a direction of forward and backward movements of said first and second transport holders, and
the notch regions of said common reverse holding member, said first reverse holding member and said second reverse holding member include a plurality of notch portions through which said plurality of holding portions of said first and second transport holders can pass.

8. The substrate processing apparatus according to claim 4, wherein a distance between tips of said plurality of first supporters and tips of said plurality of fourth supporters and a distance between tips of said plurality of second supporters and tips of said plurality of third supporters are set to be substantially equal to the distance between the holding position of the substrate by said first transport holder of said transport device and the holding position of the substrate by said second transport holder of said transport device.

9. The substrate processing apparatus according to claim 4, wherein
said common reverse holding member is secured to said support member,
said first driving mechanism moves said first reverse holding member relative to said common reverse holding member so that said first reverse holding member is selectively shifted between the state where said first reverse holding member and said common reverse holding member are spaced apart from each other and the state where said first reverse holding member and said common reverse holding member are close to each other, and
said second driving mechanism moves said second reverse holding member relative to said common reverse holding member so that said second reverse holding member is selectively shifted between the state where said second reverse holding member and said common reverse holding member are spaced apart from each other and the state where said second reverse holding member and said common reverse holding member are close to each other.

10. The substrate processing apparatus according to claim 4, wherein
said common reverse holding member includes
a third reverse holding member provided so as to face said first reverse holding member, and
a fourth reverse holding member provided so as to face said second reverse holding member,
said plurality of first supporters are provided on a surface of said third reverse holding member facing said first reverse holding member,
said plurality of third supporters are provided on a surface of said fourth reverse holding member facing said second reverse holding member,
said first driving mechanism moves at least one of said first reverse holding member and said third reverse holding member so that said first reverse holding member and said third reverse holding member are selectively shifted between a state where said first reverse holding member and said third reverse holding member are spaced apart from each other and a state where said first reverse holding member and said third reverse holding member are close to each other, and
said second driving mechanism moves at least one of said second reverse holding member and said fourth reverse holding member so that said second reverse holding member and said fourth reverse holding member are selectively shifted between a state where said second reverse holding member and said fourth reverse holding member are spaced apart from each other and a state where said second reverse holding member and said fourth reverse holding member are close to each other.

11. The substrate processing apparatus according to claim 4, further comprising a first cleaning processing unit that cleans the back surface of the substrate wherein said transport device transports the substrate between said reversing device and said first cleaning processing unit.

12. The substrate processing apparatus according to claim 11, further comprising a second cleaning processing unit that cleans the top surface of the substrate, wherein said transport device transports the substrate among said reversing device, said first cleaning processing unit and said second cleaning processing unit.

* * * * *